United States Patent [19]

Nakagome et al.

[11] Patent Number: 5,266,848
[45] Date of Patent: Nov. 30, 1993

[54] CMOS CIRCUIT WITH REDUCED SIGNAL SWING

[75] Inventors: Yoshinobu Nakagome, Hachioji; Kiyoo Itoh, Higashikurume, both of Japan; Kan Takeuchi, Cambridge, England

[73] Assignee: Hitachi, Ltd., Tokyo, Japan

[21] Appl. No.: 674,602

[22] Filed: Mar. 25, 1991

[30] Foreign Application Priority Data

Mar. 28, 1990 [JP] Japan .................................. 2-076880

[51] Int. Cl.⁵ .......................................... H03K 19/092
[52] U.S. Cl. ..................................... 307/475; 307/264
[58] Field of Search ........................ 307/264, 451, 475

[56] References Cited

U.S. PATENT DOCUMENTS 4,677,321  6/1987  Bacrania ........................ 307/475
4,920,284  4/1990  Denda ........................... 307/264 X

OTHER PUBLICATIONS

IEEE Journal of Solid-State Circuits, vol. 9, No. 5, pp. 256–267, Oct. 1974.
IEEE Journal of Solid-State Circuits, vol. 21, No. 5, pp. 605–611, Oct. 1986.
Proceedings of Technical Papers, 1989 International Symposium on VLSI Technology, Systems and Applications pp. 188–192, May 1989.
Proceedings of the Symposium on Low Temperature Electronics and High Temperature Superconductors, pp. 55–69, Oct. 1987.

Primary Examiner—James B. Mullins
Attorney, Agent, or Firm—Antonelli, Terry Stout & Kraus

[57] ABSTRACT

A CMOS circuit has a signal receiving unit, a signal processing unit and a driving circuit. The signal receiving unit converts a small amplitude signal from a bus into a large amplitude signal. The signal processing unit processes the large amplitude signal. The driving circuit converts the large amplitude signal processed into a small amplitude signal processed to output on the bus.

28 Claims, 17 Drawing Sheets

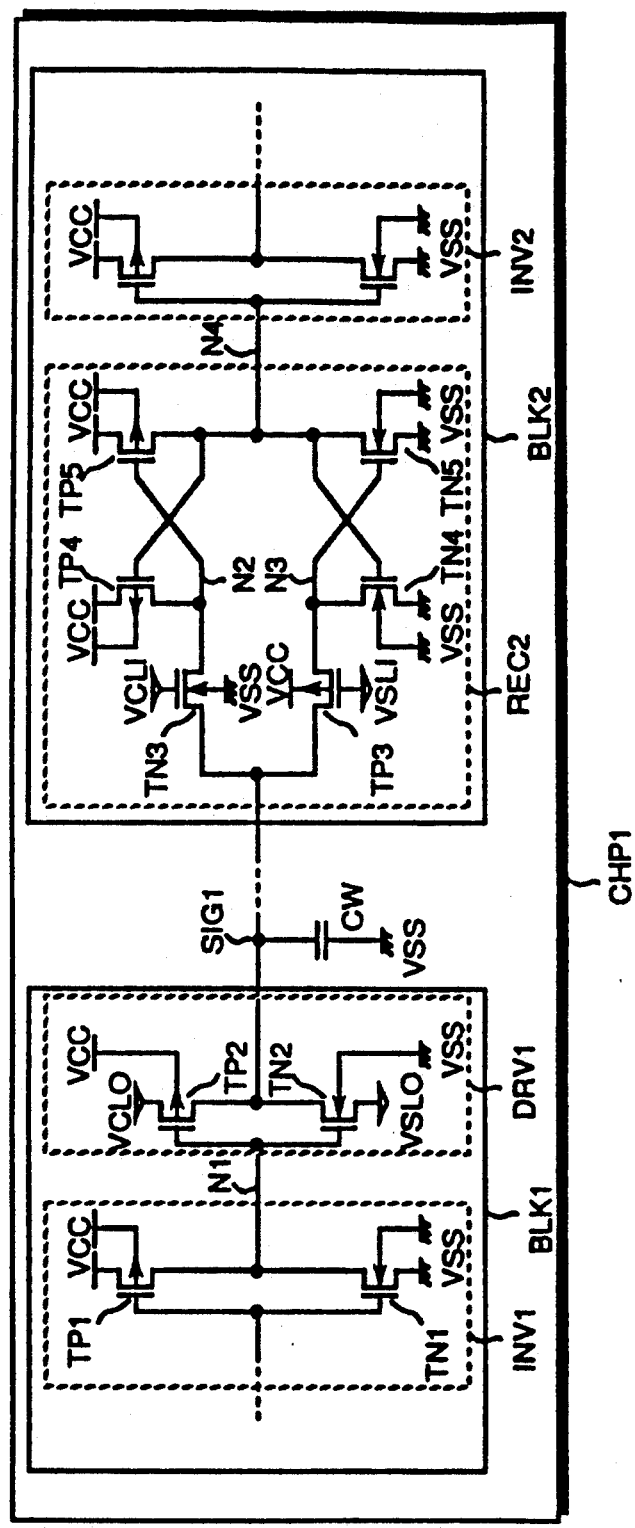
FIG. IA

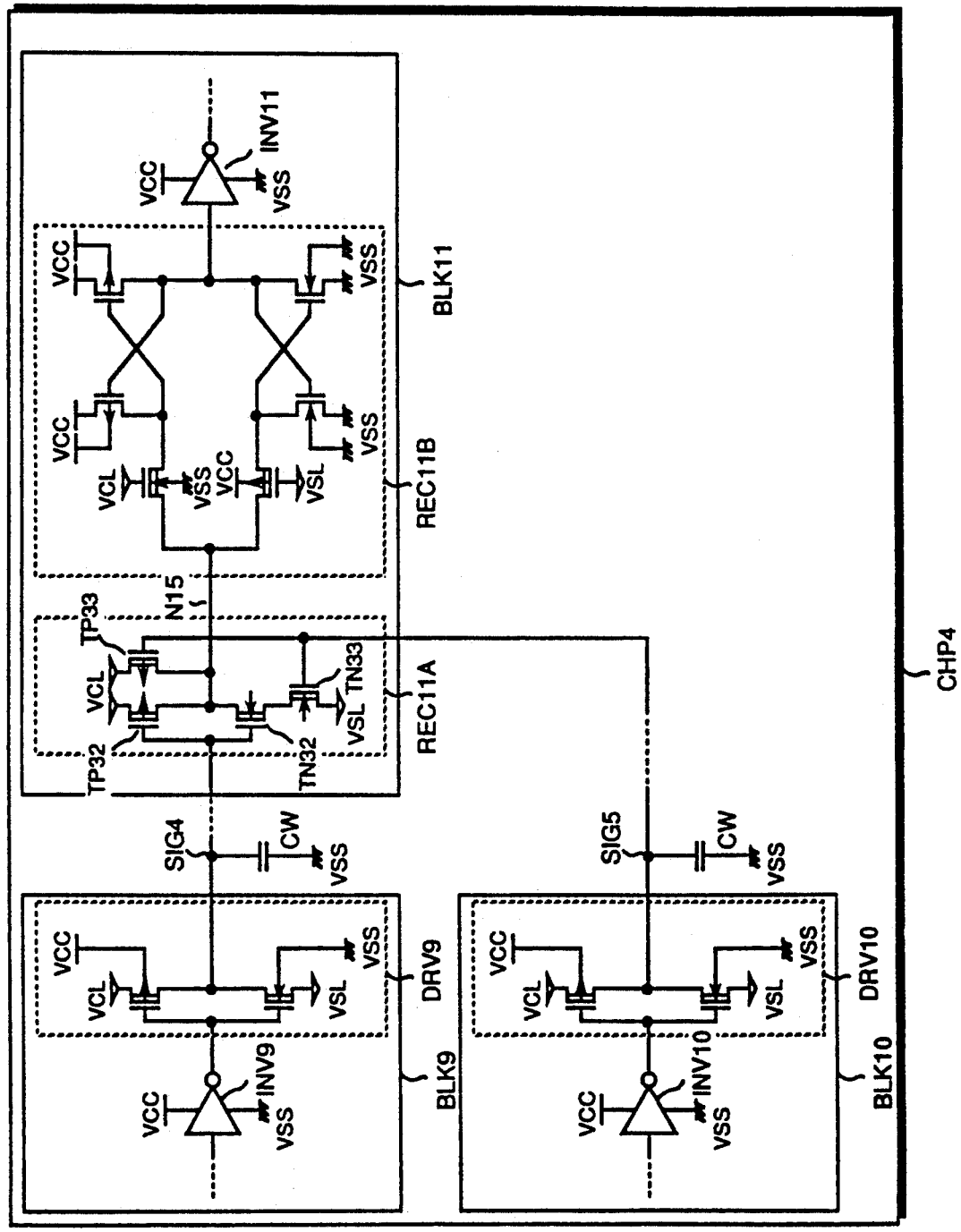
F I G. 5

CMOS CIRCUIT WITH REDUCED SIGNAL SWING

CROSS-REFERENCE TO RELEVANT APPLICATIONS

The present application is relevant to U.S. patent application Ser. No. 366,869 filed Jun. 14, 1989, entitled "Large Scale Integrated Circuit For Low Voltage Operation" in the names of J. Etoh, K. Itoh, Y. Kawajiri, Y. Nakagome, E. Kume and H. Tanaka and the contents of which are incorporated herein by reference.

BACKGROUND OF THE INVENTION

Density increase of an LSI (Large Scale Integration) has been advanced by making a MOS transistor of its component part smaller in size. With the LSI of the so-called deep sub-micron type in which its component part has the minimum size of 0.5 μm or less, there arises a problem in that the breakdown voltage of the component part is lowered and the power consumption in the LSI is increased. To solve such problems, it is believed as an effective means that the operation voltage is reduced along with miniaturization of the component part.

A 5V-supply voltage is mainly used for the supply voltage of the current LSI, and therefore, the technique by which a voltage conversion circuit for lowering the operating voltage is mounted on an LSI chip is discussed as the means for constructing an LSI by small component parts in "IEEE Journal of Solid-State Circuits", vol. 21, No. 5, pp. 605-611, October 1986. In this case, the values of the external supply voltage and the internal supply voltage are 5 V and 3.5 V, respectively. Thus, there is being actualized the problem of the power consumption in a dynamic RAM (DRAM) with the highest integration out of the LSIs.

On the other hand, however, it is indicated that there is a lower limit in the supply voltage due to physical limitations. Such limitations are discussed in "IEEE Journal of Solid-State Circuits", vol. 9, No. 5, pp. 256-267, October 1974. As indicated in this paper, the low level current characteristics of a MOS transistor include therein the so-called sub-threshold characteristic in which a drain current decreases exponentially in relation to a gate voltage. The coefficient inherent therein is called the sub-threshold coefficient (tailing coefficient) and has a value of the order of 80 mV/decade at room temperature. Accordingly, a problem is encountered in that when the gate threshold voltage is reduced proportionally with the reduction of the supply voltage, a low-level current flows even during the cut-off period of the transistor, thus increasing a current consumption in the stand-by state. For this reason, with the prior art CMOS circuit, it was considered that if the supply voltage is lowered, the threshold voltage cannot be decreased below a predetermined value. This lower limit for the practical application is discussed in "Proceedings of Technical Papers, 1989 International Symposium on VLSI Technology, Systems and Applications", pp. 188-192, May 1989, and "Proceedings of the Symposium on Low Temperature Electronics and High Temperature Superconductors", pp. 55-69, Oct. 1987. That predetermined threshold voltage value is approximately 0.35 to 0.55 V or so. At this time there arises a problem in that the lower limit of the supply voltage is 1.5 V or so in the practical application, and therefore, any further decrease in the voltage will cause a delay time to remarkably increase.

SUMMARY OF THE INVENTION

It is therefore an object of the present invention to provide a semiconductor integrated circuit that is capable of operating at a high speed in the case of even a signal swing smaller than the supply voltage, which has been conventionally postulated as the lower limit, and does not cause the increase in current consumption in the stand-by state.

The above object can be attained by setting a plurality of a signal swings within an integrated circuit to drive main buses with a small amplitude and by the provision of an amplitude conversion circuit for converting a small signal swing into a large signal swing with a small stand-by current.

As a result, since the amplitudes of internal signals in various types of integrated circuit (hereinafter, referred to as simply "an IC", when applicable) can be reduced, a charge and discharge current through a bus can be reduced and the less power consumption can be attained. Moreover, since a peak current can be reduced, electro-migration can be reduced, the problem of and noise can be lowered. Further, a charge and discharge time for a bus can be shortened, and high speed operation can be realized. Thus, the power consumption can be reduced by not being restricted by a lower limit of the supply voltage which has become a problem in the prior art circuit system, so that high integration, high speed operation and less power consumption ca be attained simultaneously.

These and other objects and many of the attendant advantages of the present invention will be readily appreciated as the same becomes better understood by reference to the following detailed description when considered in connection with the accompanying drawing.

BRIEF DESCRIPTION OF THE DRAWINGS

FIGS. 1A and 1B, and FIG. 2 respectively illustrate embodiments useful in explaining a basic concept of the present invention;

FIG. 5 illustrates a concrete embodiment in which the present invention is applied to a NAND gate circuit;

DESCRIPTION OF THE PREFERRED EMBODIMENT

Figure 1B:
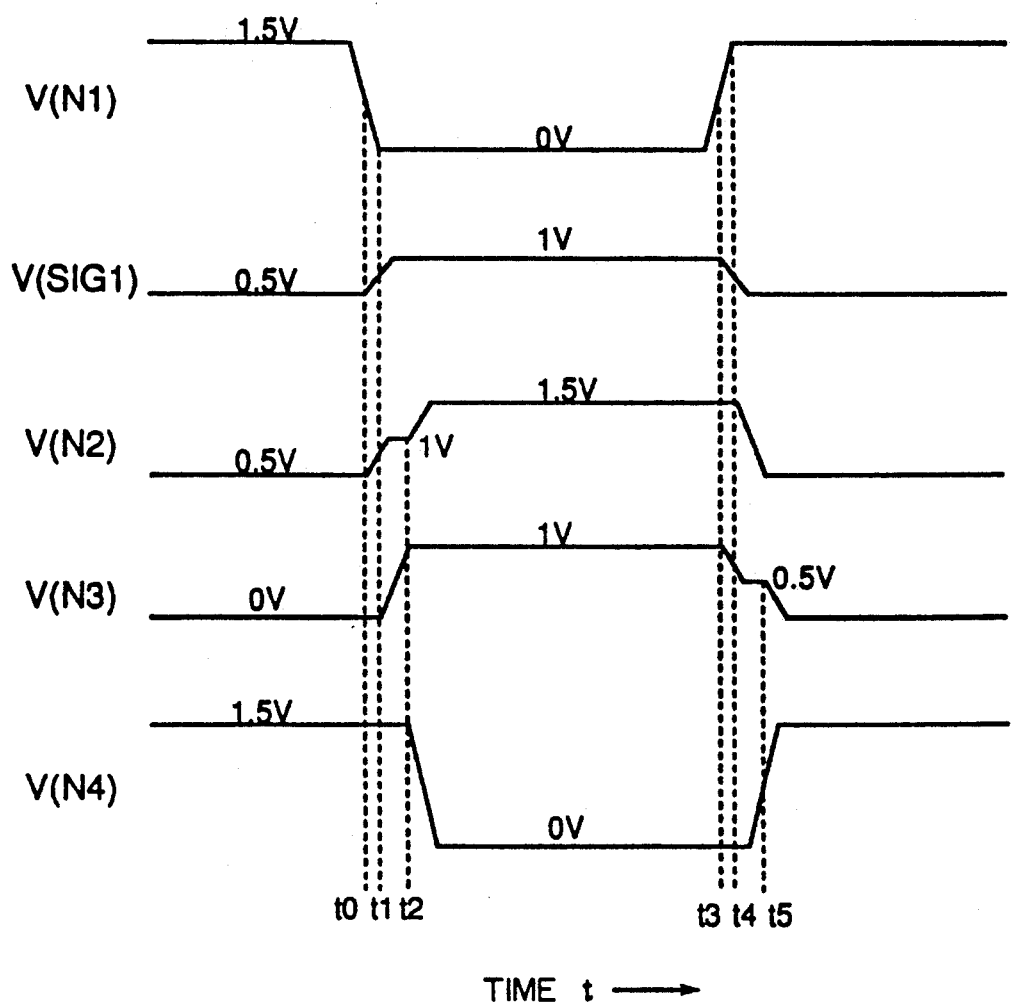

FIG. 1A shows one embodiment useful in explaining the basic concept of CMOS integrated circuit (hereinafter, referred to as simply "a CMOS IC", when applicable) according to the present invention. In FIG. 1A, the CMOS IC is made up of a plurality of circuit blocks, e.g., BLK1 and BLK2, and buses through which signals are transmitted between the circuit blocks. In the present embodiment shown in FIG. 1A an output from BLK1 is transmitted to an input of BLK2. Those circuit blocks are made up of a signal receiving unit (e.g., REC2 in the figure) for receiving a signal with a small amplitude (or small magnitude swing) from another (e.g., preceding) circuit block to convert it into a signal with a large amplitude, signal processing units (e.g., INV1 and INV2 in the figure) for processing the signal with a large amplitude, and a driving unit (e.g., DRV1 in the figure) for outputting the signal with a small amplitude on a bus.

Out of these units, each of the signal processing units is driven by supply voltages VCC and VSS, so that the signal swing of the processed signal becomes (VCC-VSS). The driving circuit DRV1 consists of an N-channel MOS transistor TN2 and a P-channel MOS transistor TP2. This driving circuit is driven by supply voltages VCLO and VSLO to output a signal with an amplitude of (VCLO−VSLO) on a bus SIG1. Now, the following relationship is established among those supply voltages:

$$VCC > VCLO > VSLO > VSS$$

Incidentally, although the back gate of TN2 and that of TP2 are connected to VSS and VCC, respectively, alternatively these gates may be connected to VSLO and VCLO, respectively.

The signal receiving unit REC2 consists of an N-channel MOS transistor TN3 a P-channel MOS transistor TP3, a pair of N-channel MOS transistors TN4 and TN5 in which the respective gates and drains are cross-connected to each other, and a pair of P-channel MOS transistors TP4 and TP5 having the respective gates and drains cross-connected to each other. To the gate of the transfer gate TN3 and the gate of TP3 are respectively applied voltages VCL1 and VSL1. Incidentally, although the back gate of TN3 and that of TP3 are connected to VSS and VCC, respectively, alternatively those gates may be connected to VSLO and VCLO, respectively. In the present embodiment, a gate threshold voltage of each N-channel MOS transistor is set at about 0.5 V while that of each P-channel MOS transistor is set at about −0.5 V.

The operation of this circuit will now be described with reference to FIG. 1B. In the present embodiment, the description will be given with respect to the case of VCC=1.5 V, VSS=0V, VCLO=1 V, VSLO=0.5 V, VCLI=1.5 V and VSLI=0 V. Those voltages are not limited to these values. That is, instead thereof, such voltages that maintains the following relationships may hold:

$$VCC > VCLO > VSLO > VSS, \text{ and } VCLI > VSLI$$

Then, let us consider the specific case where the output N1 for the inverter INV1 in the circuit block BLK1 changes from 1.5 V to 0 V at t0 and changes from 0 V to 1.5 V at t3.

In the period before t0, i.e., as long as a voltage at the terminal N1 is 1.5V, the voltage across the gate and source of the transistor TN2 is 1 V, while that across the gate and source of the transistor TP2 is 0.5 V. As a result, TN2 conducts and TP2 nonconducts, so that the output from the driving circuit, i.e., VSLO=0.5 V is created on the bus SIG1. Simultaneously, the voltage across the gate and source of the transfer gate TN3 constituting the receiving circuit REC2 becomes 1 V and that across the gate and source of the transistor TP3 becomes −0.5 V, and therefore, TN3 conducts while TP3 nonconducts. Since the driving capability of the transistor TN3 is designed in such a way as to be sufficiently large in comparison with that of TP4, the voltage at a terminal N2 is equal to the input SIG1, i.e., 0.5 V, so that the transistor TP5 conducts. In the meantime, since the voltage at an terminal N3 is 0.5 V or less, the transistor TN5 nonconducts so that the voltage at a terminal N4 is 1.5 V. Accordingly, the transistor TN4 conducts, and as a result the voltage at the terminal N3 is set at 0 V. With the transistor TP3 out of those transistors, the voltage across the gate and source thereof is −0.5 V, thus corresponding to the gate threshold voltage. Therefore, a small current which is called the subthreshold current flows through the transistor TP3. However, the ratio according for that transistor percent of the transistors of the whole IC is small, and therefore, the current thus flowing is so small as to be capable of being ignored. Then, let us consider the case where the voltage at the terminal N1 is changed from 1.5 V to 0 V at t0. At this time, the voltage across the gate and source of the transistor TN2 becomes −0 5 V, and that across the gate and source of the transistor TP2 becomes −1 V. As a result, TN2 nonconducts while TP2 conducts, so that the output of the driving circuit, i.e., VCLO=1 V is created on the bus SIG1. Simultaneously, the voltage across the gate and source of the transfer gate TN3 constituting the receiving circuit REC2 is 0.5 V, and that across the gate and source of the transistor TP3 is −1 V, so that TN3 nonconducts while TP3 conducts. By designing the driving capability of the transistor TP3 in such a way as to be sufficiently large in comparison with that of the transistor TN4, the voltage at the terminal N3 is set at 1 V which is equal to the input SIG1, so that the transistor TN5 conducts. In the mean time, the voltage at the terminal N2 increases up to about 1 V. Accordingly, the transistor TP5 nonconducts, so that the voltage at the terminal N4 is 0 V. As a result, the transistor TP4 conducts, so that the voltage at the terminal N2 is caused to increase up to 1.5 V at t2.

In the case where the voltage at the terminal N1 changes from 0 V to 1.5 V at t3, in a similar way to the above case, the voltage created on the bus SIG1 changes from 1 V to 0.5 V whereas the voltage at the terminal N4 changes from 0 V to 1.5 V.

In such a way, it is possible to convert the signal with an amplitude of 1.5 V within the circuit block BLK1 into the signal with an amplitude of 0.5 V and to reconvert the latter into the former with a signal swing of 1.5 V within the circuit block BLK2. In general, most of the power consumption in the IC is due to the charge and discharge process in the lines (buses) provided for transferring the signals between the circuit blocks. Accordingly, it is very effective to decrease the voltage amplitude of the signal on the bus for providing the whole IC with less power consumption. Moreover, by making the voltage amplitude of the signal within the IC block larger than the signal swing of the signal on the bus, it is possible to increase the operation speed of the circuitry in the block. At the same time, it is possible to drive a gate of an inverter circuit (driver) for driving the bus with an amplitude larger than that of the bus. That is, such an advantage as to improve the switching speed of the bus can be also provided. In the present embodiment, the amount of charge required for charging and discharging a load capacitor CW connected to the bus SIG1 can be reduced by one-third, i.e., from CW (VCC−VSS) to CW(VCLO−VSLO). This allows both the current consumption and the power consumption to be reduced by about one-third. Moreover, if the comparison is made with respect to the same operation speed, a peak current through the bus and the supply line generated along with the charge and discharge of the capacitor can be also reduced by one-third. As a result, reliability of the wiring constituting both the bus and the supply line can be also improved. Further, the power supply noise arising from the resistance of the supply line can be also reduced by one-third. That is, an IC which is more stably operated can be provided. Thus, by reducing the signal swings of the main lines, an IC in which there are the less power consumption and the low noise can be realized while maintaining a high speed operation.

The above description has been given with respect to the specific case where the circuitry is constructed using the six supply voltages VCC, VSS, VCLO, VSLO, VCLI and VSLI. As indicated in the present embodiment, some of those voltages may be the same voltage. All of those voltages may be supplied from the external side. Alternatively, the voltages such as VCLO, VSLO, VCLI and VSLI may be generated by a voltage conversion circuit provided in the IC with VCC and VSS being applied from the external side of the system. Instead thereof, the voltages such as VCC, VSS, VCLI and VSLI may be generated by the voltage conversion circuit provided in the IC with VCLO and VSLO being applied from the external side of the system, or VCC, VSS, VCLO and VSLO may be generated in the IC with VCLI and VSLI being applied from the outside of the system.

Figure 2:
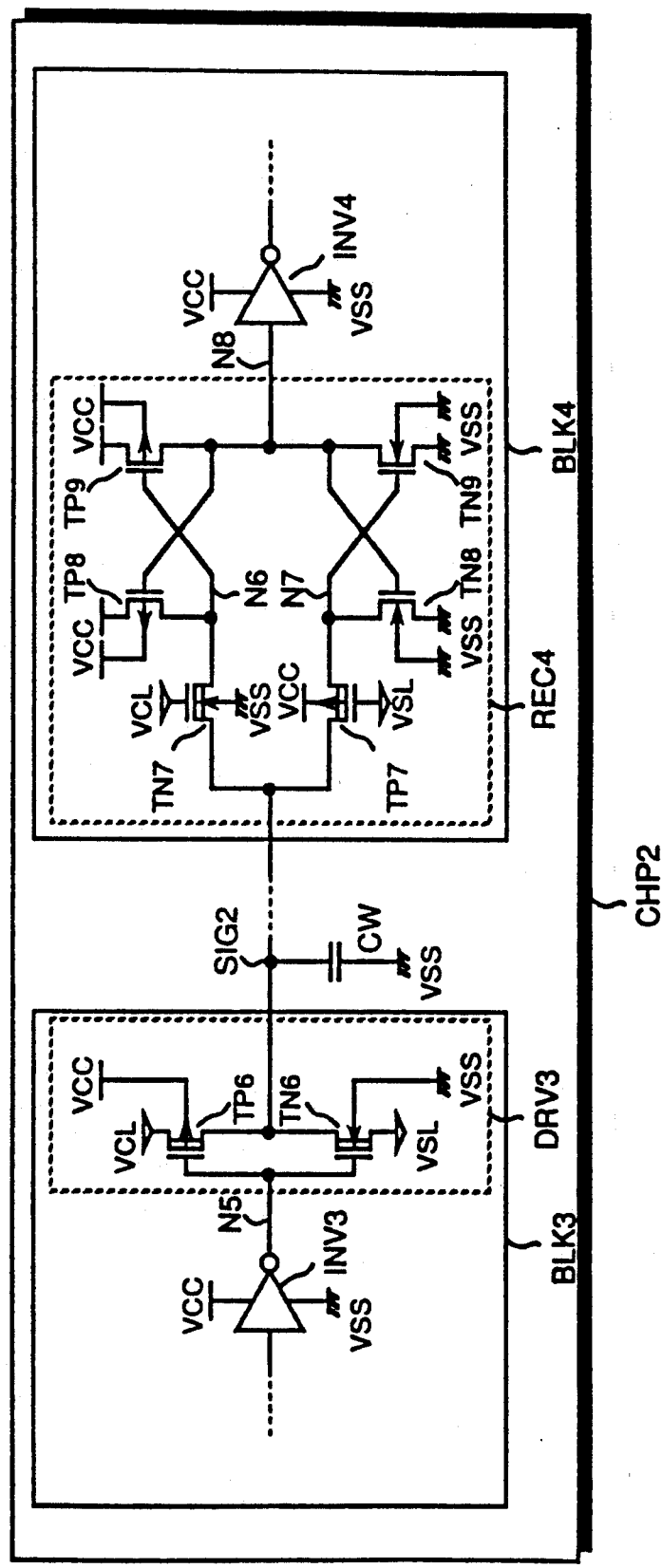

FIG. 2 shows another embodiment of the CMOS IC according to the present invention. In the present embodiment, in order to decrease the kinds of power supplies to be used, there is provided a plurality of threshold voltages in each conductivity type of MOS transistor. In the figure, the present embodiment is substantially the same in construction as the embodiment shown in FIG. 1 except that the absolute values of the gate threshold voltages of an N-channel MOS transistor TN6 and a P-channel MOS transistor TP6 both making up a driving circuit DRV3, and an N-channel MOS transistor TN7 and a P-channel MOS transistor TP7 both making up a transfer gate for a signal receiving unit REC4 are made smaller than those of MOS transistors constructing other circuits. Thus, the supply voltages for the driving circuit and the gate applied voltage for the transfer gate can be set at VCL and VSL. In this regard, although back gates of TN6 and TN7 and those of TP6 and TP7 are connected to VSS and VCC, respectively, alternatively the former and the latter may be connected to VSL and VCL, respectively. In the present embodiment, with the absolute values of the gate threshold voltages of N-channel MOS transistors, higher one is about 0.5 V while lower one is about 0 V, and with those of the gate threshold voltages of the P-channel MOS transistors, higher one is about −0.5 V while lower one is about 0 V.

The operation of this circuit is similarly described with the operation waveforms shown in FIG. 1B. It should be noted that although particularly in the present embodiment, the description will now be given with respect to the case of VCC=1.5 V, VSS=0 V, VCL=1 V, VSL=0.5 V, it is apparent that those voltages are not limited to these values.

In the period before t0, i.e., as long as the voltage at a terminal N5 is 1.5 V, the voltage across the gate and source of the transistor TN6 is 1 V, and that across the gate and source of the transistor TP6 is 0.5 V. This results in that TN6 conducts while TP6 nonconducts, thus outputting the output of the driving circuit, i.e., VSL=0.5 V, on a bus SIG2. At the same time, since the voltage across the gate and source of the transfer gate TN7 constituting the receiving circuit REC4 is 0.5 V, and that across the gate and source of the transistor TP7 is 0 V, TN7 conducts while TP7 nonconducts. By designing the driving capability of the transistor TN7 in such a way as to be sufficiently large in comparison with that of the transistor TP7, the voltage at a terminal N6 is 0.5 V which is equal to the input SIG2, so that a transistor TP9 conducts. In the mean time, the voltage at a terminal N7 is 0.5 V or less, and therefore, a transistor TN9 nonconducts so that the voltage at a terminal N8 is 1.5 V. Accordingly, a transistor TN8 conducts, and as a result the voltage at the terminal N7 is set at 0 V. With the transistor TP7 out of those transistors, the voltage across the gate and source thereof is 0 V, thus corresponding to the gate threshold voltage. For this reason, a small current which is called the subthreshold current flows through the transistor TP7. However, the ratio according for that transistor percent of the transistors of the whole IC is small, and therefore, the current thus flowing is so small as to be capable of being ignored. The operations at other times are also similar to those of the embodiment shown in FIG. 1. Thus, the usage of the MOS transistors having two kinds of gate threshold voltages inherent therein for each conductivity type allows the circuit to be constructed with the four supply voltages VCC, VSS, VCL and VSL. All of those voltages may be supplied from the external side, or alternatively the voltages such as VCL and VSL may be generated by a voltage conversion circuit provided in the IC with VCC and VSS being applied from the external side of the system. Instead thereof, VCC and VSS may be generated by the voltage conversion circuit provided in the IC with VCL and VSL being applied from the outside of the system. Incidentally, according to the present embodiment, the same effects as those described in the previous embodiment can be also obtained.

Figure 3A:
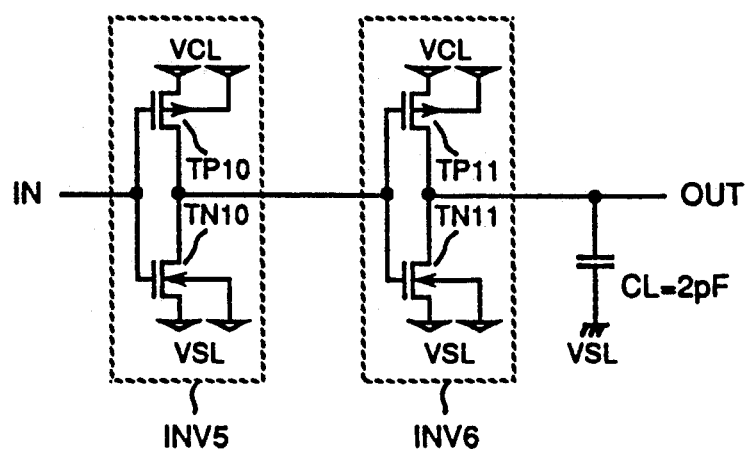
FIGS. 3A to 3E illustrate the characteristic comparison results to a prior art circuit for showing the effects of the present invention.
Figure 3B:
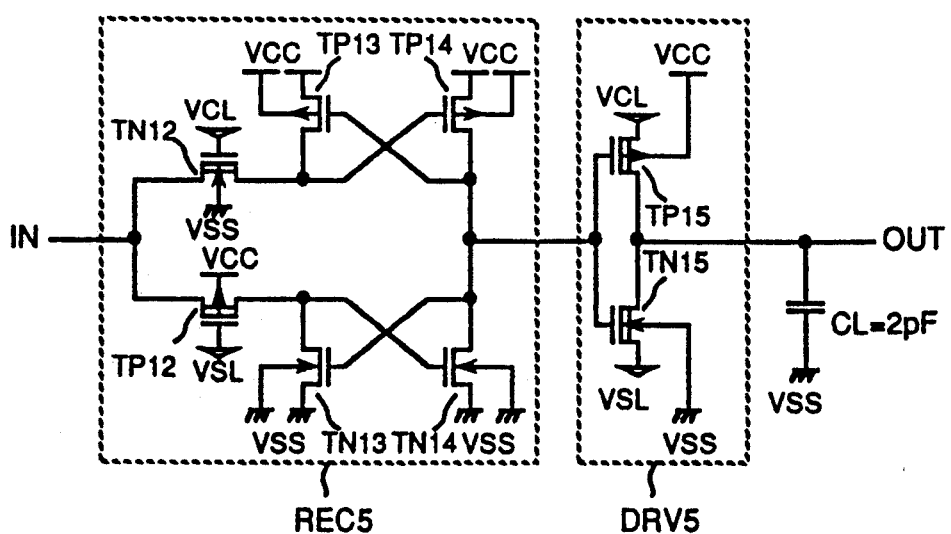

The effects of the present invention will subsequently be described in detail with reference to FIG. 3. FIG. 3A shows an example of the driving circuit for the load capacitor (CL=2pF) constructed using the prior art, while FIG. 3B shows that constructed using the present invention In any case, the driving circuit is constructed in such a way that a signal with an amplitude of (VCL−VSL) is inputted and the load is driven by the signal with the amplitude of (VCL−VSL). In the prior art CMOS IC, as shown in FIG. 3A, the driving circuit is made up of a plurality of stages of CMOS inverters. The amplitude of the supply voltage is directly equal to the signal swing in the CMOS inverter, and therefore, VCL and VSL are used as the power supply. On the other hand, in the present invention, as shown in FIG. 3B, the driving circuit is made up of a level conversion circuit REC5 for amplifying an amplitude of an input signal, and a CMOS inverter circuit DRV5 for driving a load. REC5 and DRV5 are the same in basic construction as REC4 and DRV3 shown in FIG. 2, respectively. Moreover, the gate threshold voltages of the respective transistors are also the same value described in FIG. 2. The thickness of a gate oxide film of the MOS transistor is 7 nm (nanometer), and the gate length L and the gate width W of each transistor are as follows:

|  | L (μm) | W (μm) |
|---|---|---|
| TN10 | 0.6 | 6 |
| TP10 | 0.6 | 20 |
| TN11 | 0.6 | 15 |
| TP11 | 0.6 | 50 |
| TN12 | 0.6 | 6 |
| TP12 | 0.6 | 10 |
| TN13 | 2 | 1 |
| TP13 | 2 | 3 |
| TN14 | 0.6 | 6 |
| TP14 | 0.6 | 20 |
| TN15 | 0.6 | 15 |
| TP15 | 0.6 | 50 |

As a result, the power consumption in the circuit of the present invention is substantially equal to that in the prior art circuit in the stand-by state.

Figure 3C:
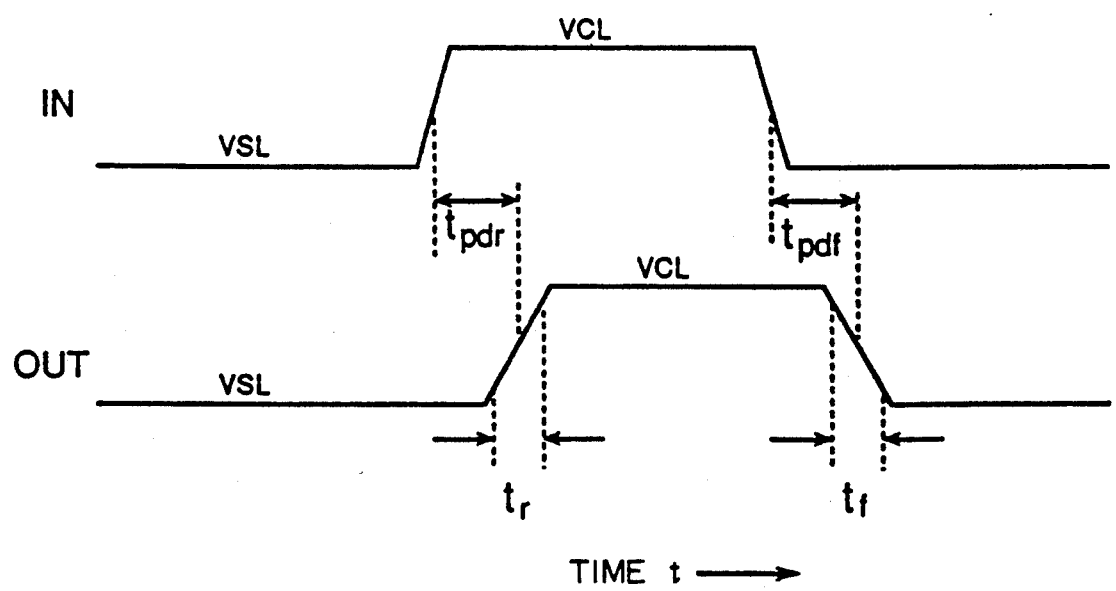

FIG. 3C shows wave forms of an input (IN) and an output (OUT). An output rise time tr is defined by the time period required for the output to rise from 10% to 90%; an output fall time tf is defined by the time period required for the output to fall from 90% to 10%; a rise propagation delay time tpdr, the time period required for the output to rise up to 50% after the input has rose up to 50%; a fall propagation delay time tpdf, the time period required for the output to fall down to 50% after the input has fell down to 50%.

Figure 3D:
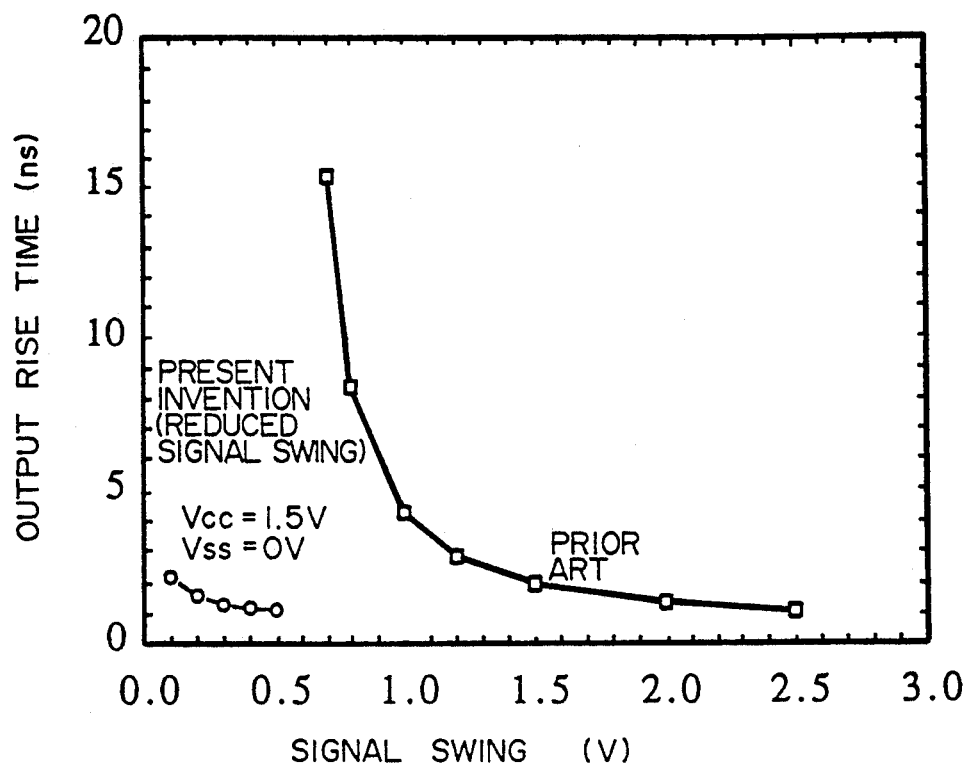

FIG. 3D shows the result of computer analysis with respect to the output rise time tr vs. the signal swing (VBCL-VSL). In the case of the driving circuit utilizing therein the prior art CMOS inverter, the rise time sharply increases when the signal swing is less than 1.5 V. The relationship between the signal swing and the rise time is typically shown as follows:

| signal swing (V) | output rise time tr (ns) |
|---|---|
| 2 | 1.37 |
| 1.5 | 1.98 |
| 1 | 4.25 |

If one criteria for judgment is given by the relation of tr<2ns, the minimum value of the signal swing is 1.5 V. On the other hand, in the case of the present invention, the relationship between the signal swing and the rise time is given as follows:

| signal swing (V) | output rise time tr (ns) |
|---|---|
| 0.5 | 1.09 |
| 0.4 | 1.17 |
| 0.3 | 1.30 |
| 0.2 | 1.55 |
| 0.1 | 2.16 |

If one criteria for judgment is likewise given by tr<2ns, the minimum value of the signal swing is 0.12 V. In view of this analytical result, if the output rise time tr is considered as the reference, according to the present invention, the signal swing can be reduced by one order of magnitude from 1.5 V (prior art) to about 0.12 V. Incidentally, it should be noted that although the analytical result is shown with respect to the output rise time tr here, the similar improved effect can be also obtained with the output fall time tf.

Figure 3E:
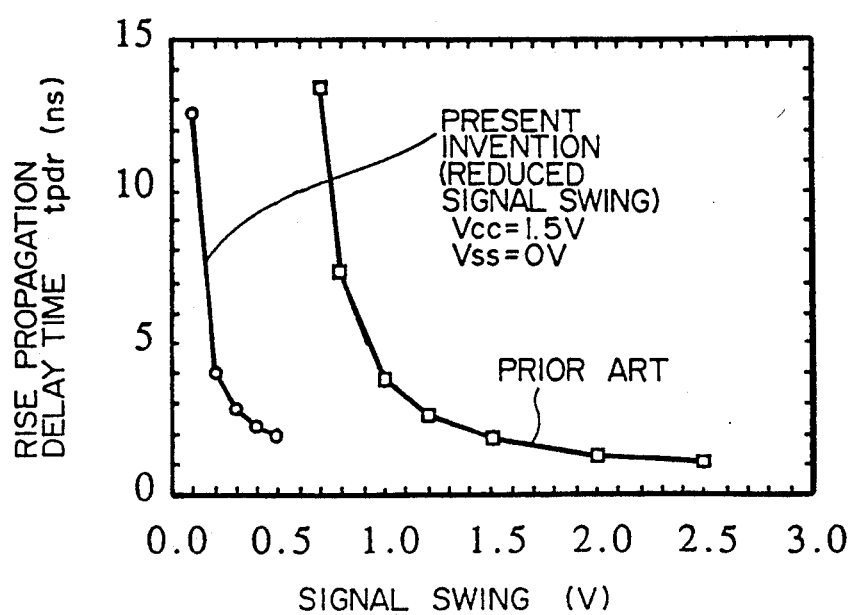

FIG. 3E shows the result of computer analysis with respect to the rise propagation delay time tpdr vs. the signal swing (VCL−VSL). In the case of the driving circuit utilizing the prior art CMOS inverter, in a similar manner to the rise time, the rise propagation delay time sharply increases when the signal swing is less than 1.5 V. The relationship between the signal swing and the rise propagation delay time is typically shown as follows:

| signal swing (V) | rise propagation delay time tpdr (ns) |
|---|---|
| 2 | 1.29 |
| 1.5 | 1.82 |
| 1 | 3.81 |

If one criteria for judgment is given by tpdr<3ns, the minimum value of the signal swing is about 1.2 V. On the other hand, in the case of the present invention, the relationship between the signal swing and the rise propagation delay time is given by:

| signal swing (V) | rise propagation delay time tpdr (ns) |
|---|---|
| 0.5 | 1.97 |
| 0.4 | 2.29 |
| 0.3 | 2.84 |
| 0.2 | 3.99 |

If one criteria for judgment is likewise given by tpdr<3ns, the minimum value of the signal swing is about 0.31 V. Taking this analytical result into consideration, when the rise propagation delay time tpdr is considered as the reference, according to the present invention, the signal swing can be reduced by about one-fourth from about 1.2 V (prior art) to about 0.31 V. Incidentally, it should be noted that although the analytical result is shown with respect to the rise propagation delay time tpdr, the similar improved effect can be also obtained with the fall propagation delay time tpdf.

FIG. 4 shows still another embodiment of the CMOS IC according to the present invention. In the embodiment previously shown in FIG. 1 or FIG. 2, the small current flows either from the signal receiving unit to the bus or from the bus to the signal receiving unit during the signal transition between a high level and a low level. In the case where the rise time or fall time of the signal is large due to the influence of the parasitic resistance and the parasitic capacitance thereupon, and further in the case where a number of signal receiving circuits are connected to one bus, the smaller that current, the more preferable from the view point of the circuit operation.

Figure 4A:
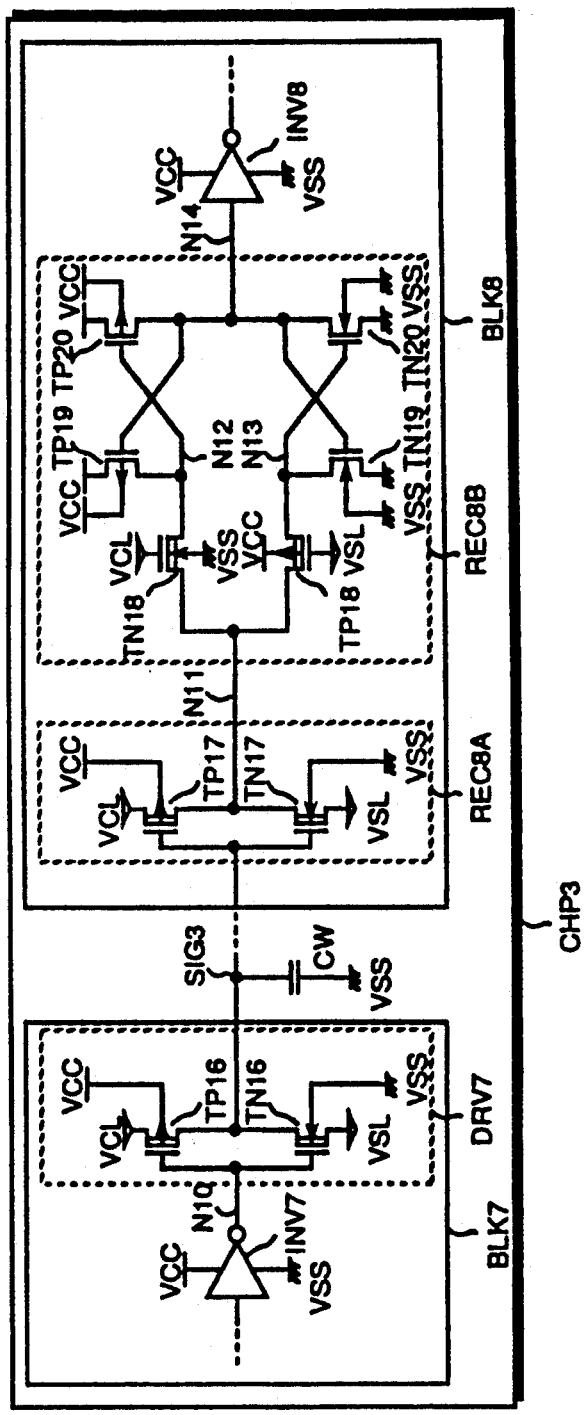
FIGS. 4A and 4B illustrates another embodiment useful in explaining the basic concept of the present invention.

FIG. 4A shows one example of the construction which is designed in such a way as not to cause the dc current to flow through the circuitry. In this embodiment, a signal receiving unit for receiving a signal with a small amplitude from another circuit block to convert it into a signal with a large amplitude is made up of a receiving circuit REC8A comprising a CMOS inverter, and a level conversion circuit REC8B. The inverter circuit in REC8A is, similarly to an inverter circuit in a driving circuit DRV7 in the figure, operated by VCL and VSL as the power supply. The level conversion circuit REC8B is the same in basic construction a sd REC4 shown in FIG. 2. In the figure, the absolute values of the gate threshold voltages of an N-channel MOS transistor TN16 and a P-channel MOS transistor TP16 both making up the driving circuit DRV7, an N-channel MOS transistor TN17 and a P-channel MOS transistor TP17 both making up the inverter in the receiving circuit REC8A, and an N-channel MOS transistor TN18 and a P-channel MOS transistor TP18 both making up a transfer gate and included in the level conversion circuit REC8B are made smaller than those of MOS transistors constituting other circuits. Incidentally, back gates of TN16, TN17 and TN18, and those of TP16, TP17 and TP18 are connected to VSS and VCC, respectively. Alternatively, however, the former and the latter may be connected to VSL and VCL, respectively. In a similar manner to the embodiment shown in FIG. 2, with the absolute values of the gate threshold voltages of the N-channel MOS transistors, higher one is about 0.5 V while lower one is about 0 V, and with those of the gate threshold voltages of the P-channel MOS transistors, higher one is about −0.5 V while lower one is about 0 V.

Figure 4B:
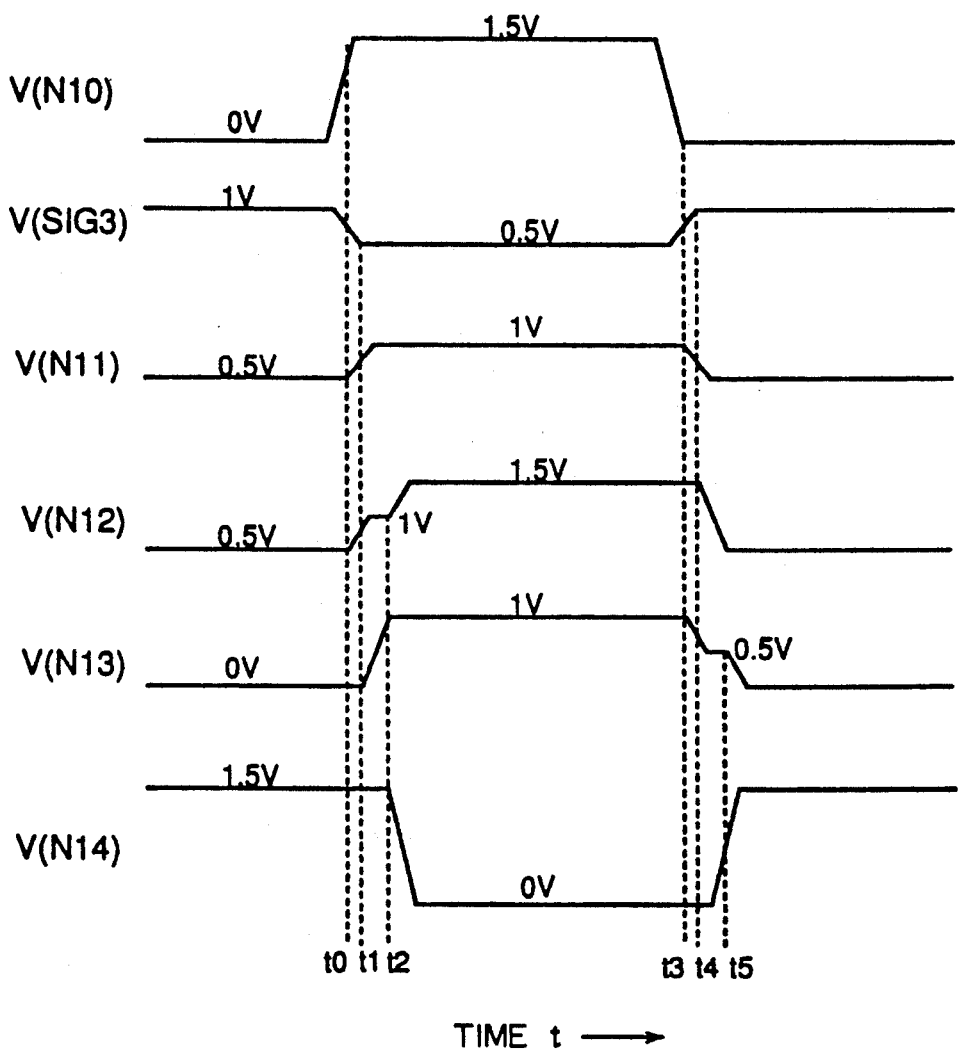

The operation of this circuit is described with the operation waveforms shown in FIG. 4B. The difference between the present embodiment shown in FIG. 4 and the embodiment shown in FIG. 2 is that the input to the level conversion circuit REC8B is not directly driven by the bus, but instead it is driven by the inverted output from the inverter. Accordingly, in the present embodiment, the signal at a terminal N14 is created by inverting the signal at a terminal N10, but the basic operation is the same as the previous embodiment. Incidentally, it should be noted that although particularly in the present embodiment, the description will now be given with respect to the case of VCC=1.5V, VSS=0V, VCL=1V, and VSL=0.5V, it is obvious that those voltage are not limited to these values.

In such a way, the signal receiving unit is made up of the CMOS inverter and the level conversion circuit, thereby to prevent the dc current from flowing from the bus into the signal receiving unit, or the dc current from flowing out from the signal receiving unit to the bus. In this regard, through the CMOS inverter constituting the receiving circuit, a dc current flows from the power supply VCL to VSL. However, the number and size of component parts constituting the inverter are so small as to be capable of being ignored in comparison with those of component parts included in the whole IC. For this reason, there is no large influence of that current flowing through the inverter upon the current consumption in the IC.

FIG. 5 shows yet another embodiment of the CMOS IC according to the present invention. The present embodiment provides a signal receiving unit in which a plurality of signals each having a small amplitude are inputted to be subjected to a logical operation, and the result of the logical operation is then converted into a signal with a large amplitude to be used in the circuit blocks.

Particularly in the present embodiment, the signal receiving unit is made up of a receiving circuit REC11A comprising a NAND gate, and a level conversion circuit REC11B. The NAND gate in REC11A is, in a similar manner to REC8A shown in FIG. 4A, driven by VCL and VSL as the power supply. The level conversion circuit REC11B is the same in basic construction as REC4 shown in FIG. 2 or REC8B shown in FIG. 4.

In the same way a the conventional CMOS circuit, the NAND gate is made up of two N-channel MOS transistors TN32 and TN33 connected in series, and two P-channel MOS transistors TP32 and TP33 connected in parallel. To the NAND gate are inputted two signals SIG4 and SIG5 which are respectively supplied from other blocks VBLK9 and BLK10, thus creating the NAND output at a terminal N15. For the MOS transistors constituting the NAND gate, in a similar manner to REC8A shown in FIG. 4A, ones each having a smaller absolute value of the gate threshold voltage are used. By taking such a construction, the logical operation result of a plurality of reduced signal swings can be taken as a large swing signal in the circuit blocks. As one example of the logical operation, the description has been given with respect to the case of the 2-input NAND gate in the present embodiment. But, it will be apparent that the logical operation of any other logical circuit, e.g., 3 or more-input NAND, 2 or more-input NOR, or EOR (Exclusive-OR) can be similarly applied to this circuit.

Figure 6:
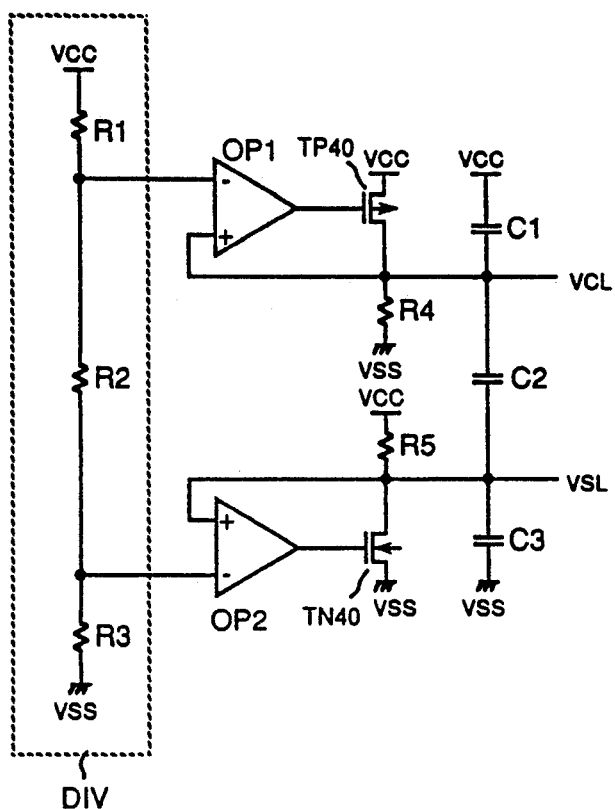
FIG. 6 illustrates a concrete embodiment of a circuit for generating an internal supply voltage according to the present invention.

FIG. 6 shows one embodiment of a construction of a circuit for generating supply voltages VCL and VSL in the chip on the basis of external supply voltages VCC and VSS.

In the figure, DIV is a voltage dividing circuit consisting of three resistors R1, R2 and R3, OP1 and OP2 are differential amplifying circuits, TP40 is a P-channel MOS transistor for driving VCL, TN40 is an N-channel MOS transistor for driving VSL, R4 and R5 are biasing resistors, and C1 to C3 are de-coupling capacitors. VCL and VSL obtained by this circuit are expressed by the following relationships:

$$VCL=(R2+R3)\times(VCC-VSS)/(R1+R2+R3)$$

$$VSL=R3\times(VCC-VSS)/(R1+R2+R3)$$

For example, in the case of VCC=1.5 V, VSS=0 V, and R1=R2=R3, VCL=1 V and VSL=0.5 V are obtained from the above relationship.

Figure 7B:
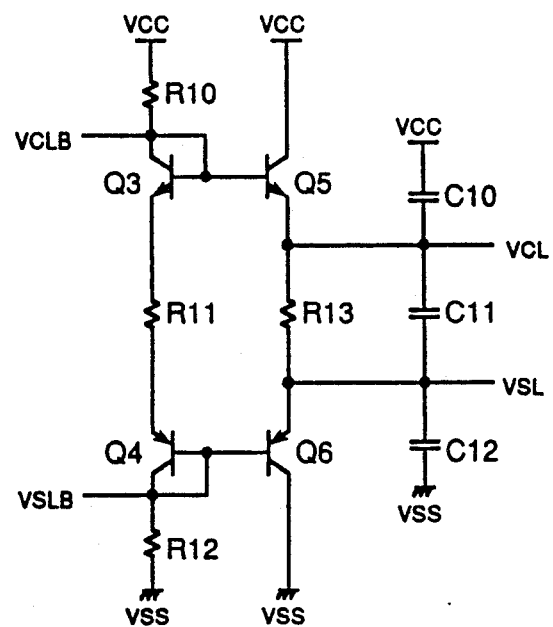
FIGS. 7A and 7B illustrate still another embodiments employing therein bipolar transistors useful in explaining the basic concept of the present invention.
Figure 7A:
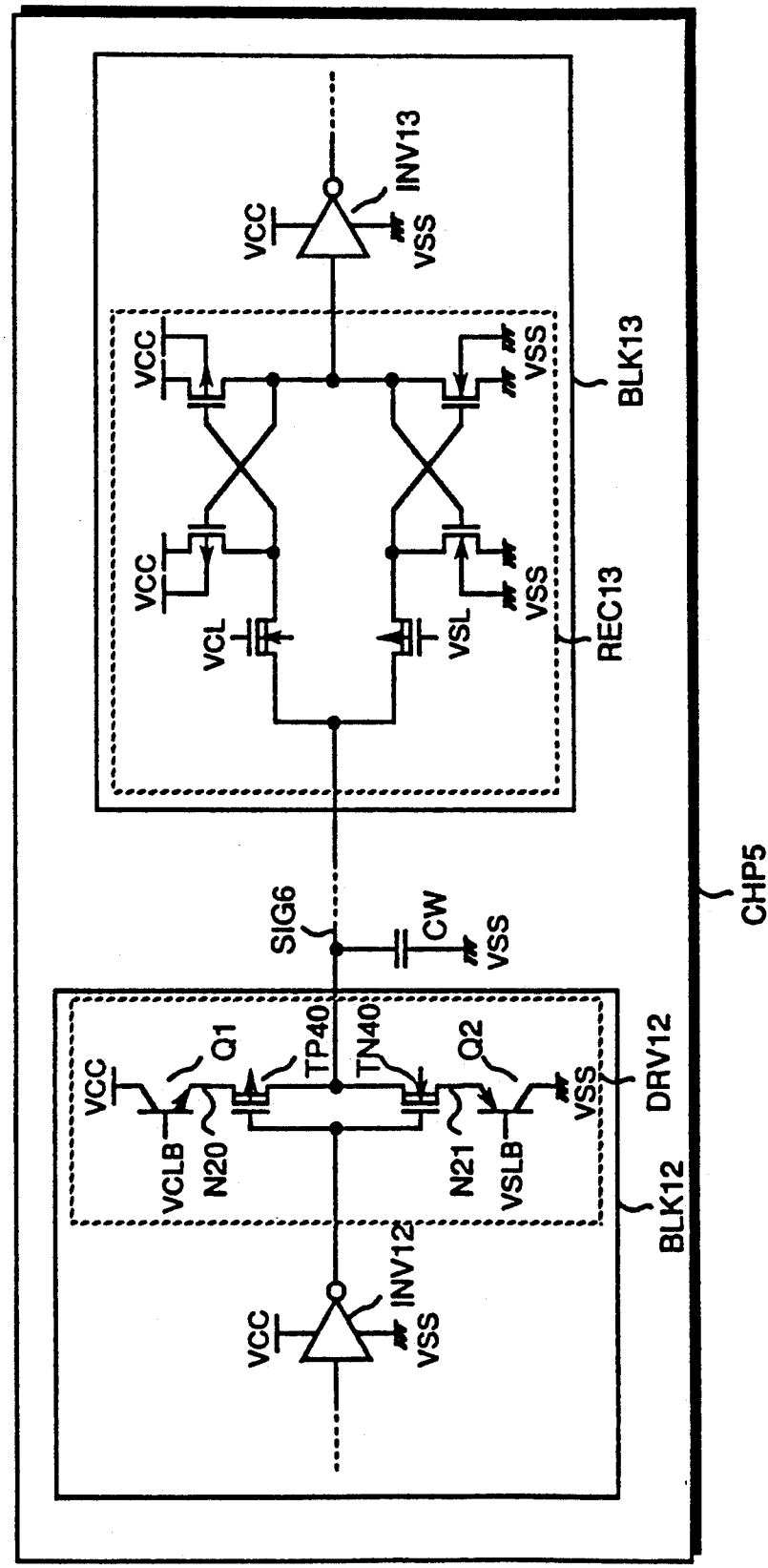

FIG. 7A shows a further embodiment of the IC according to the present invention. In the present embodiment, the common power supplies VCL and VSL are not supplied to the driving circuits for driving the buses, but instead VCC and VSS are supplied thereto, thus reducing the signal swing at every driving circuit.

In FIG. 7A, CHP5 is an IC chip, BLK12 and BLK13 are circuit blocks constituting the chip, SIG6 is a bus for transmitting a small swing signal from BLK12 to BLK13, DRV12 is a driving circuit for driving a bus, and REC13 is a signal receiving circuit. This circuit is the same in basic construction as that shown in FIG. 2 except for the driving circuit DRV12.

The driving circuit DRV12 is made up of an N-channel MOS transistor TN40, a P-channel MOS transistor TP40, an NPN type bipolar transistor Q1, and a PNP type bipolar transistor Q2. The two bipolar transistors are connected at collector terminals to the power supplies VCC and VSS, respectively, while being connected at emitter terminals to a CMOS inverter. To base terminals of the respective bipolar transistors are applied dc voltage VCLB and VSLB. The values of these dc voltages are respectively expressed as follows:

$$VCLB = VCL + VBE$$

$$VSLB = VCL - VBE$$

where VBE represents a forward voltage drop across the base and emitter of the bipolar transistor and takes the value of about 0.75 V. This connection allows VCL and VSL to be created at terminals N20 and N21, respectively. According to this circuit system, there is no need for the power supply such as VCL or VSL to have such a low impedance as in the embodiment shown in FIG. 2. Accordingly, there is also no need for the internal voltage generating circuit as shown in FIG. 6 to provide with a large driving capability, thus preventing the generating circuit itself from consuming a large surface area and preventing increase in the power consumption. Incidentally, instead of the NPN and PNP type bipolar transistors used in the present embodiment, an N-channel and P-channel MOS transistors may be used, respectively. In this case, the same effects can be also obtained.

FIG. 7B shows another embodiment of the construction of the circuit for generating supply voltages VCL, VSL, VCLB and VSLB in the chip on the basis of external supply voltages VCC and VSS.

In the figure, a voltage driving circuit is made up of three resistors R10, R11 and R12, and an NPN and PNP type bipolar transistors Q3 and Q4 in each of which a base and an emitter are connected to each other. Q5 is an NPN type bipolar transistor for driving VCL, Q6 is a PNP type bipolar transistor for driving VSL, R13 is a biasing resistor, and C10 to C12 are decompling capacitors. The voltages VCL and VSL obtained by this circuit are expressed by the following relationship:

$$VCL = ((R11 + R12) \times VCC + (R10 - R11 - R12) \times VBE) / (R10 + R11 + R12)$$

$$VSL = (R12 \times VCC + (R10 + R11 - R12) \times VBE) / (R10 + R11 + R12)$$

where VSS=0 is assumed, and VBE represents a forward voltage drop across the base and emitter of the bipolar transistor and takes the value of about 0.75 V. For example, in the case of VCC=3 V, and $0.25 \times R11 = R10 = R12$, VCL=2 V and VSL=1 V are obtained from the above relationships.

Figure 8:
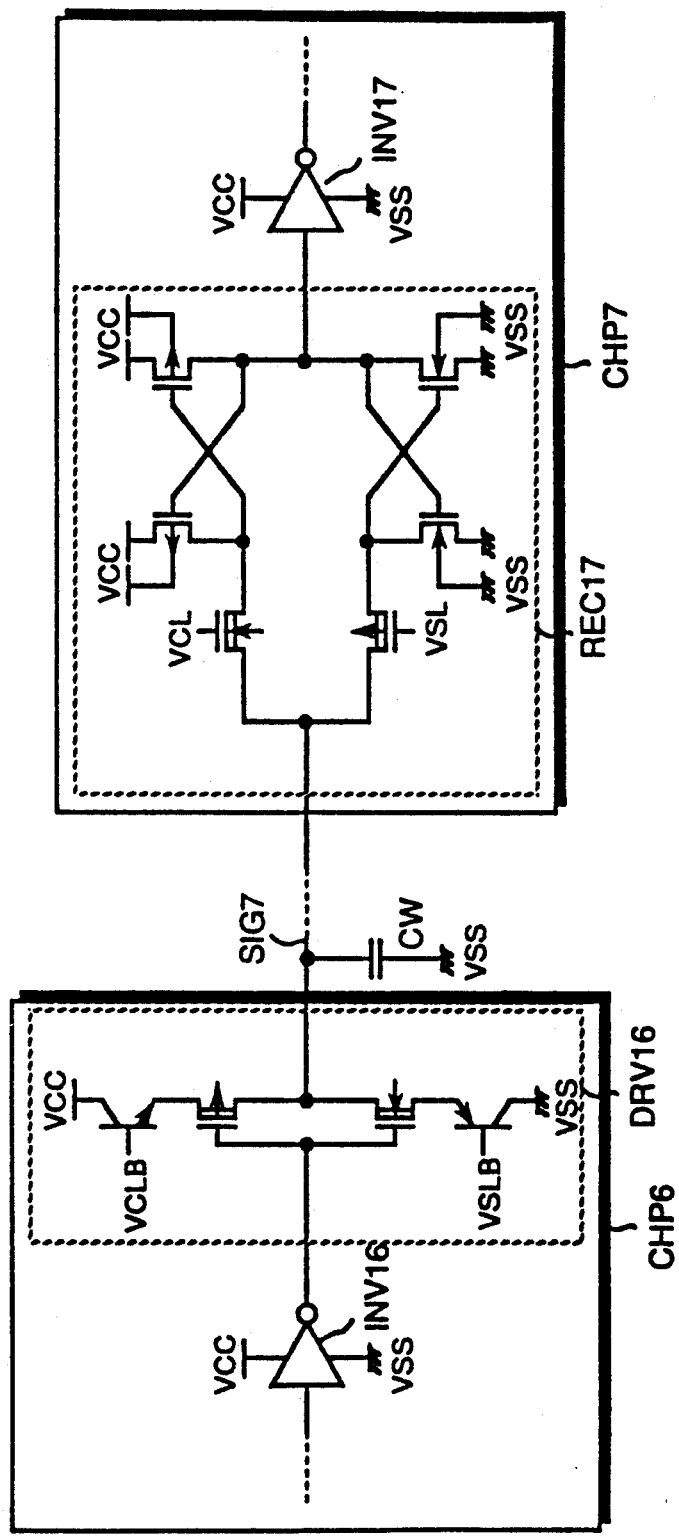
FIG. 8 and FIG. 9 illustrate other embodiments in each of which the present invention is applied to a signal transmission between chips.

FIG. 8 shows an even further embodiment of the IC according to the present invention. The present embodiment is designed in such a way that the signal transmission between IC chips is performed with the reduced signal swing.

In the figure, CHP6 and CHP7 are IC chips, SIG7 is a bus for transmitting a signal with a small amplitude from CHP6 to CHP7, DRV16 is a driving circuit for driving a bus, and REC17 is a signal receiving circuit. The driving circuit DRV16 and the receiving circuit REC17 are the same in basic construction as DRV12 and REC13 shown in FIG. 7A, respectively.

With such a construction, the power required for driving a heavily capacitive bus between the chips can be reduced. In addition thereto, the peak current generated along with the charge and discharge of the bus can be reduced to a low level, the reliability of the bus can be improved, and the supply line noise can be reduced. Accordingly, particularly in an IC, such as a microprocessor, having therein a number of buses, there is provided a large effect.

Moreover, in the conventional input circuit of the IC chip, there was a problem in that in response to an input with a TTL level (e.g., maximum value of LOW criterion level $VIL_{MAX} = 0.8$ V, and minimum value of HIGH criterion level $VIH_{MIN} = 2.4$ V), a current flows through a CMOS inverter, and therefore, it is impossible to reduce a current during the stand-by state. If the receiving circuit according to the present invention is used, however, that current can be remarkably reduced during the stand-by state, and therefore, this is very effective for reducing the current consumption in the IC chip.

Figure 9:
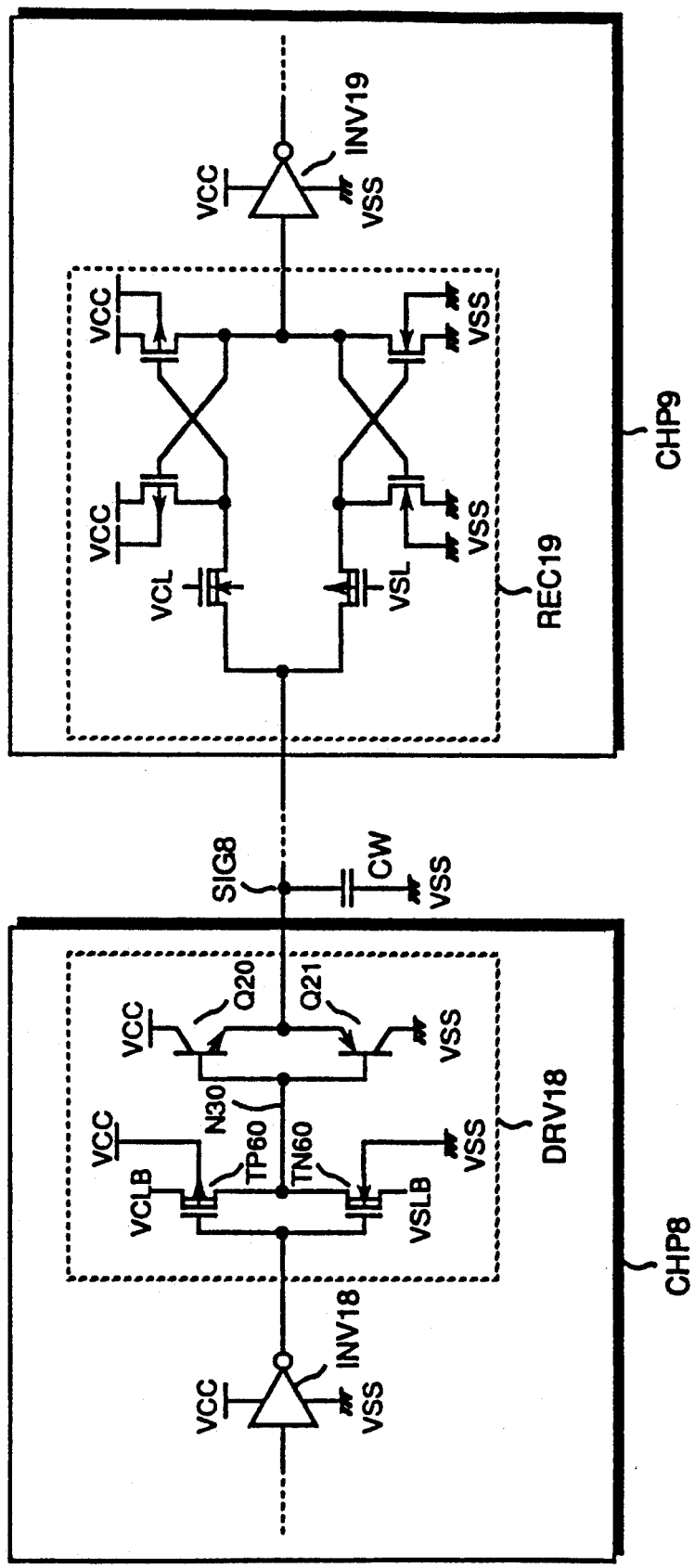

FIG. 9 shows a further embodiment of the IC according to the present invention. The present embodiment is also designed in such a way that the signal transmission between ICs is carried out with the reduced signal swing in a similar way to the embodiment shown in FIG. 8.

In the figure, CHP8 and CHP9 are IC chips, SIG8 is a bus for transmitting a small amplitude signal from CHP8 to CHP9, DRV18 is a driving circuit for driving a bus, and REC19 is a signal receiving circuit. The driving circuit is made up of a complementary inverter circuit consisting of an NPN type bipolar transistor Q20 and a PNP type bipolar transistor Q21, and a CMOS inverter circuit provided in such a way as to drive the base terminals of the former each serving as an input. To the supply voltages for the CMOS inverter circuit are given VCLB and VSLB, so that (VCL−0 VBE) as a high level and (VSL−VBE) as a low level are provided for an input of the complementary inverter circuit. This allows (VCL−VSL) to be provided as the signal swing on the bus.

With that construction, the power required for driving a large capacity-bus between the chips can be reduced. In addition thereto, the peak current generated along with the charge and discharge of the bus can be reduced to a low level, the reliability of the bus can be improved, and the supply line noise can be reduced. Especially, since the output circuit is constructed by only the bipolar transistors, a large load driving capability can be obtained in comparison with the embodiment shown in FIG. 8.

FIG. 10 to FIG. 13 show other embodiments of the CMOS IC according to the present invention. In these embodiments, there are shown other constructions of signal receiving units each of which is designed in such a way that a plurality of small amplitude signals are inputted to be subjected to a logical operation, and the result of the logical operation is then converted into a large amplitude signal to be used in circuit blocks.

Figure 10:
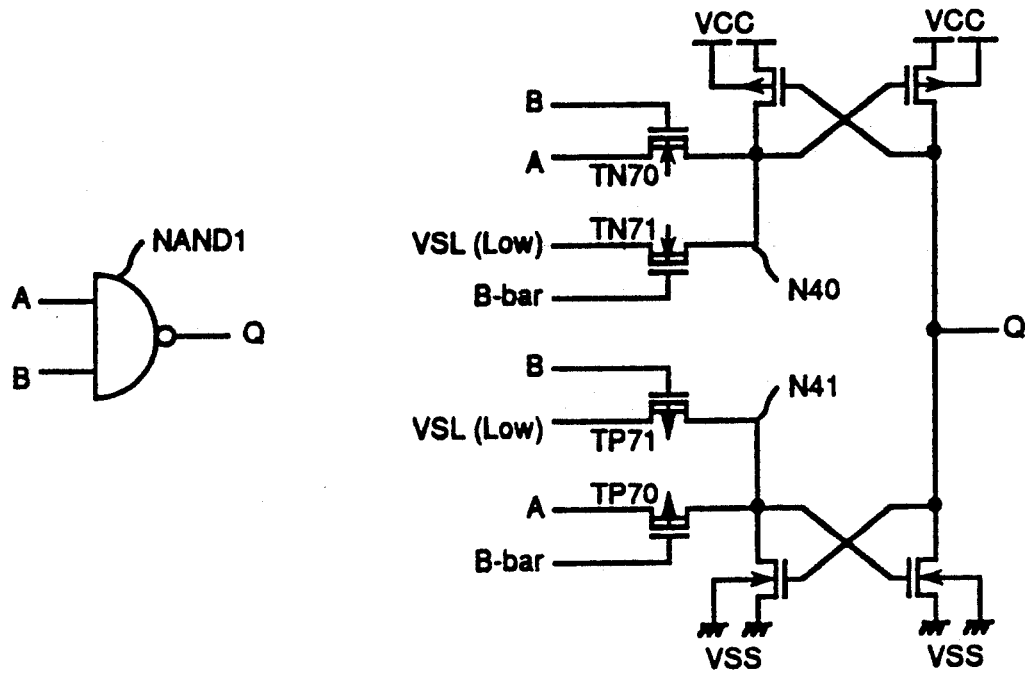
FIG. 10 to FIG. 13 illustrate other embodiments in which the present invention is applied to respective logical circuits.

FIG. 10 shows one example of network connection of the signal receiving unit which is designed in such a way as to output an operation result Q of an inverted logical product (NAND) of two inputs A and B. That is, the output Q goes to a low level when both the inputs A and B are on a high level, and in any other case, the output Q goes to a high level. With a signal swing of each of the inputs A and B, and an inverted signal of the input B, B-bar, in a similar manner to the embodiment shown in FIG. 2, its low level is VSL, and its high level is VCL. The inverted signal B-bar may be generated either by a driving circuit, or by the input B through an inverter provided in the receiving unit. In this circuit, in order to utilize the level conversion function of REC4 in FIG. 2 as it is and to newly provide a logical operation function added thereto, a transfer gate is made up of four transistors TN70, TN71, TP70 and TP71, thus increasing the number of inputs. Then, instead of a dc voltage, a signal is also applied to the gate terminal of the transfer gate.

The operation of this circuit will subsequently be described. When the input B is on a low level, i.e., the inverted input B-bar is on a high level, the transistor TN70 is in the nonconducting state, and the transistor TP71 is in the conducting state, so that a voltage at a terminal N40 goes to a low level. At the same time, the transistor TP70 is in the nonconducting state, and the transistor TP71 is in the conducting state, so that a voltage at a terminal N41 also goes to a low level. Accordingly, the output Q goes to a high level irrespective of the level of the input A. In the mean time, when the input B is on a high level, the transistor TN70 is in the conducting state, and the transistor TN71 is in the nonconducting state, so that the voltage at the terminal N40 goes to a level equal to that of the input A. At the same time, since the transistor TP70 is in the conducting state and the transistor TP71 is in the nonconducting state, the voltage at the terminal N41 also goes to a level equal to that of the input A. Therefore, an inverted output of the input A is created at the output Q. As a result, the output goes to a low level only when both the inputs A and B are in a high level. In the case of any other combination than the above, the output goes to a high level. In other words, the operation result of the inverted logical product (NAND) of the inputs A and B is created at the output Q.

Figure 11:
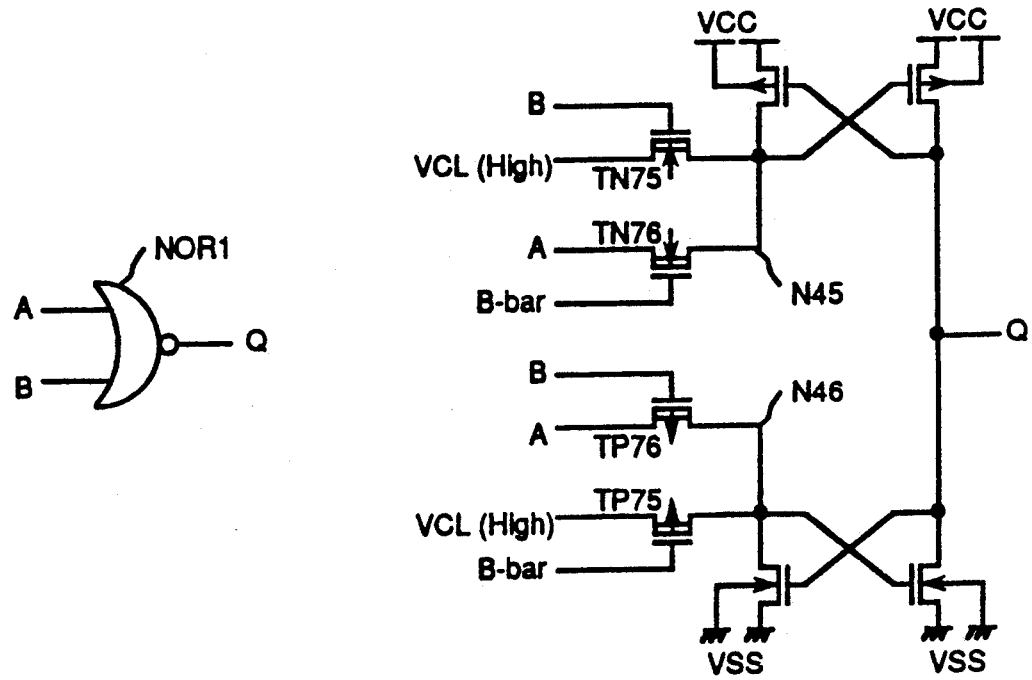

FIG. 11 shows one example of network connection of the signal receiving unit which is designed in such a way as to output an operation result Q of an inverted logical add (NOR) of two inputs A and B. That is, when both the inputs A and B are on a high level, the output Q goes to a high level, and in any other case, the output Q goes to a low level. When the input B is on a high level, i.e., the inverted input B-bar is on a low level, the transistor TN75 is in the conducting state and the transistor TN76 is in the nonconducting state, so that a voltage at a terminal N45 goes to a high level. At the same time, since the transistor TP75 is in the conducting state, and the transistor TP76 is in the nonconducting state, a voltage at a terminal N46 also goes to a high level. Accordingly, the output Q goes to a low level irrespective of the level of the input A. In the mean time, when the input B is on a low level, the transistor TN75 is in the nonconducting state and the transistor TN76 is in the conducting state, so that the voltage at the terminal N45 goes to a level equal to that of the input A. At the same time, since the transistor TP75 is in the nonconducting state and the transistor TP76 is in the conducting state, the voltage at the terminal N46 also goes to a level equal to that of the input A. Therefore, an inverted output of the input A is created at the output Q. As a result, the output goes to a high level only when both the inputs A and B are on a low level. In the case of any other combination than the above, the output goes to a low level. In other words, the operation result of the inverted logical add (NOR) of the inputs A and B is created at the output Q.

Figure 12:
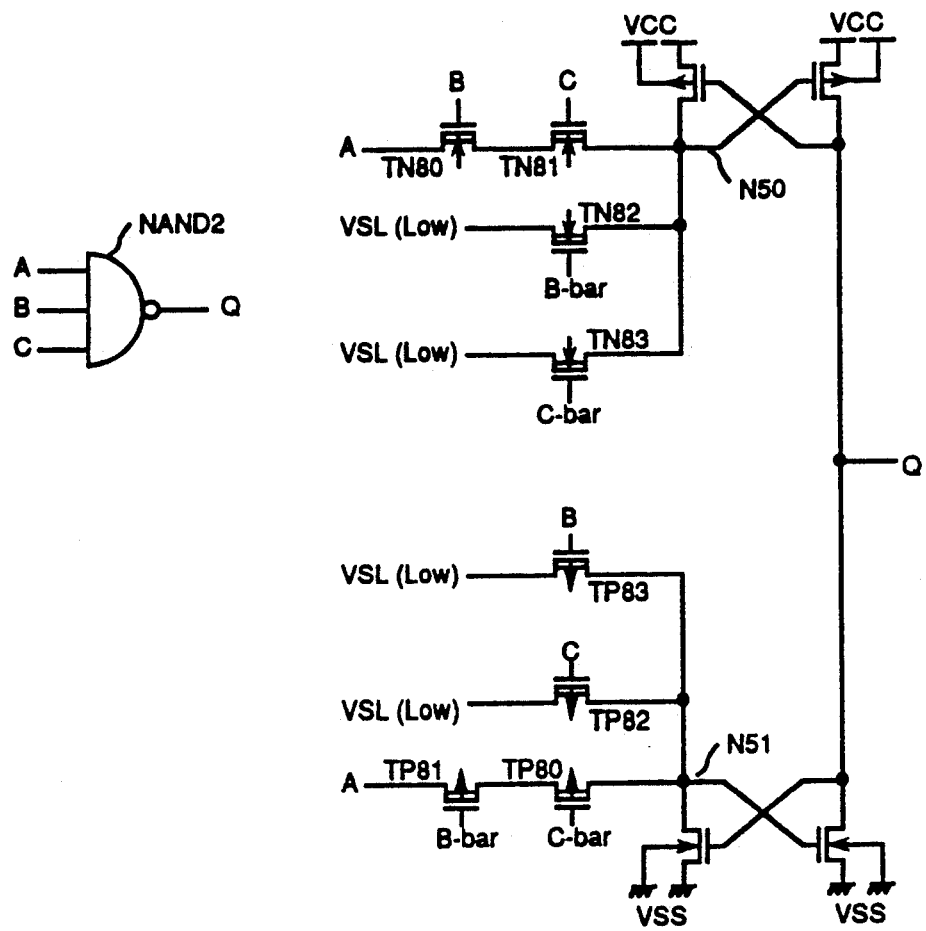

FIG. 12 shows one example of network connection of the signal receiving unit which is designed in such a way as to output an operation result Q of an inverted logical product (NAND) of three inputs A, B and C. In a similar manner to the embodiment shown in FIG. 10, when all the inputs A, B and C are on a high level, voltages at terminals N50 and N51 go to a high level. As a result, the output goes to a low level only when all the inputs A, B and C are on a high level. In the case of any other combination than the above, the output goes to a high level. In other words, the operation result of the inverted logical product (NAND) of the inputs A, B and C is created at the output Q.

Figure 13:
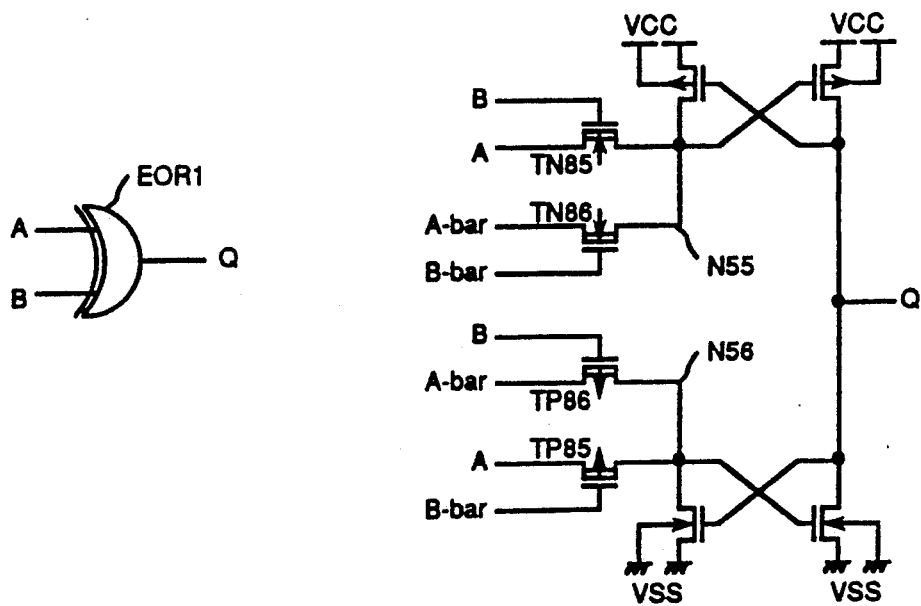

FIG. 13 shows one example of network connection of the signal receiving unit which is designed in such a way as to output an operation result Q of an exclusive logical add (Exclusive-OR=EOR) of two inputs A and B. More specifically, the output Q goes to a low level when the inputs A and B take the same level, and in any other case, the output Q goes to a high level. When the input B is on a high level, i.e., the inverted input B-bar is on a low level, the transistor TN85 is in the conducting state and the transistor TN86 is in the nonconducting state, so that a voltage at a terminal N55 goes to the same level as that of the input A. At the same time, the transistor TP85 is in the conducting state and the transistor TP86 is in the nonconducting state, so that a voltage at a terminal N56 also goes to the same level as that of the input A. Accordingly, the output Q becomes an inverted logic of the input A. In the mean time, when the input B is on a low level, the transistor TN85 is in the nonconducting state and the transistor TN86 is in the conducting state, so that the voltage at the terminal N55 goes to the same level as that of the inverted input A-bar. At the same time, the transistor TP85 is in the nonconducting state and the transistor TP86 is in the conducting state, and therefore, the voltage at the terminal N56 also goes to the same level as that of the inverted input A-bar. Accordingly, the output Q becomes the same logic as that of the input A. As a result, the operation result of the exclusive logical add (EOR) of the inputs A and B is created at the output Q.

As set forth hereinabove with respect to the aforementioned embodiments, according to the present invention, it is possible to directly carry out a logical operation on the basis of a plurality of signals each having a small input amplitude. Therefore, the number of transistors to be used can be reduced in comparison with the case where the operation is carried out after a plurality of inputs have been individually subjected to a level conversion, so that a circuit with a higher integration can be fabricated. Moreover, it is apparent that the present invention may be similarly applied to a larger number of inputs or any other logical operation, in addition to the aforementioned embodiments.

Figure 14:
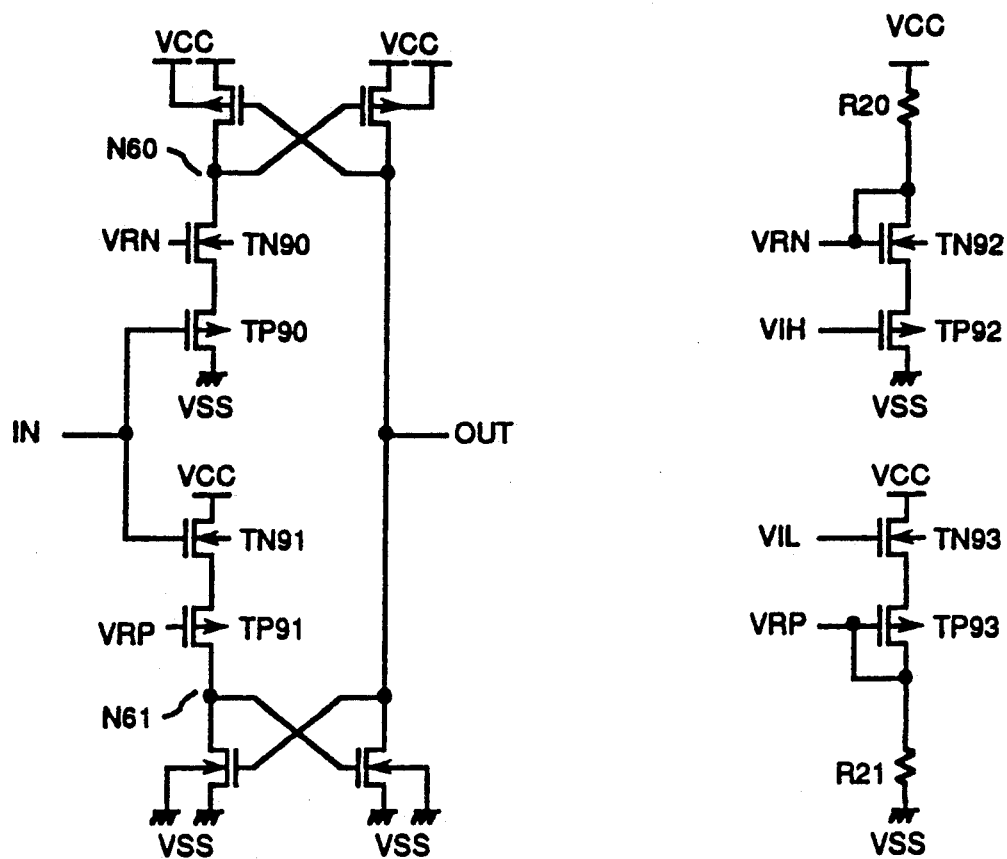
FIG. 14 to FIG. 16 illustrate other embodiments in which the present invention is applied to respective input circuits.
Figure 15:
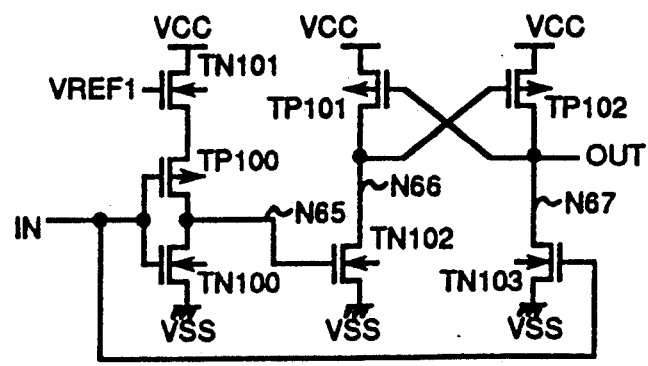
Figure 16:
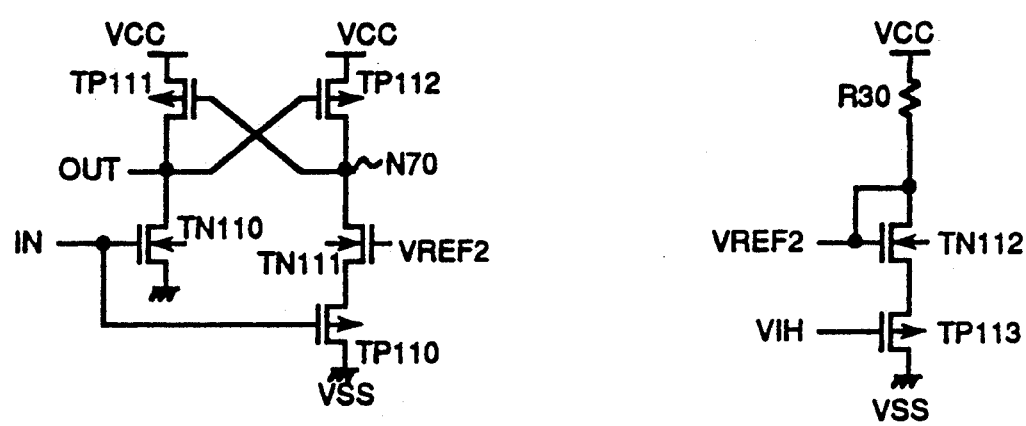

FIG. 14 to FIG. 16 show still other embodiments of the CMOS IC according to the present invention. In these embodiments, there are typically shown the CMOS ICs each of which is applied to an input circuit capable of accurately judging a logical level with even a reduced input signal swing. In general, as a signal level for an interface of a CMOS IC, there are widely used two types of level, i.e., a CMOS level and a TTL level. With a signal level for each interface, the minimum value VOHmin of its output high level (VOH), and the maximum value VOLmax of its output low level (VOL) generally take the following values: in the case of the CMOS level;

$$VOHmin = VCC - 0.1 \text{ (V)}$$

VOLmax=0.1 (V)

and in the case of the TTL level;

VOHmin=2.4 (V)

VOLmax=0.4 (V)

There is an advantage in that the operation can be carried out at a high speed and a charge and discharge current of a load capacitor can be decreased as those signal swings are smaller. On the other hand, however, there is a disadvantage in that a noise margin of a signal receiving circuit is lowered in that case. For the reason described above, as an interface used for a reduced signal swing, there has been known an ECL interface used with a bipolar LSI or a biCMOS LSI. In this case, the above values are approximately given by:

VOHmin ≈ −1.0 (V)

VOLmax ≈ −1.6 (V)

and the signal swing is so small as to be about 0.6 V. Along with higher integration of a CMOS IC and an increase in the number of signals (the number of pins) per IC, there has been strongly desired speeding up of operation and lowering of noise. However, the conventional ECL interface is the bipolar transistor based-interface, and therefore, it is difficult to apply such an interface to the CMOS circuit. Moreover there is a problem in that an input circuit needs a large biasing current flowing therethrough and this allows a power consumption (especially, a power consumption in the stand-by state) to increase. Therefore, it has been desired to realize an interface for a reduced signal swing which has a wide margin, operates stably, and is capable of maintaining a low power consumption performance, which is a feature inherent in a CMOS, by overcoming those problems. Such a new interface must fulfill the following conditions:

1) to have therein a signal swing of about 1 V or less and a sufficient noise margin; and 2) to hardly consume a current in the stand-by state (with an input being more than VIHmin or less than VILmax). In order to fulfill the above conditions, it will be necessary to realize an input circuit which detects surely a reduced input signal swing and has no current consumption in the stand-by state. Although an example of such an input circuit has been shown in FIG. 8 or FIG. 9, other examples will subsequently be shown as follows.

FIG. 14 shows one embodiment of an input circuit of the CMOS IC according to the present invention. The present embodiment is constricted in such a way as to replace the two transfer gates shown in FIG. 8 or FIG. 9 with four transistors TN90, TN91, TP90 and TP91. Reference voltage VRN and VRP are applied to gates of the TN90 and TP91, respectively. VRN and VRP are set as follows, as shown in the right side of the figure:

VRN=VIH+VTN+VTP

VRP=VIL−VTN−VTP where VIH and VIL are respectively a high level and a low level of an input signal, and VTN and VTP are respectively absolute values of threshold voltages of an N-channel transistor and a P-channel transistor.

When a voltage of an input IN is smaller in level than VIL, TN91 and TP91 are in the nonconducting state and TN90 and TP90 are in the conducting state, so that a voltage at a terminal N60 goes to a low level. As a result, an output OUT goes to a high level, and a voltage at a terminal N61 goes to a low level. To the contrary, when the voltage of the input IN is larger in level than VIH, TN91 and TP91 are in the conducting state, and TN90 and TP90 are in the nonconducting state, so that the voltage at the terminal N61 goes to a high level. As a result, the output OUT goes to a low level, and the voltage at the terminal N60 goes to a high level. Thus, it is possible to construct an input circuit which responds stably to even a reduced input signal swing. Moreover, since there is no dc current path from VCC to VSS, a current during the stand-by state can be substantially zero.

FIG. 15 shows another embodiment of the input circuit of the CMOS IC according to the present invention. In the present embodiment, an example of construction of the input circuit in the case of VIL=0 is shown. In the figure, TN100 to TN103 are N-channel transistors and TP100 to TP103 are P-channel transistors. To the gate of TN101 is applied a reference voltage VREF1 and to the source thereof is connected a CMOS inverter consisting of TN100 and TP100. Moreover, the input and the output created by the inverter are applied to TN103 and TN102, respectively. A level conversion circuit is made up of those TN102, TN103, TP101, and TP102. The value of the reference voltage VREF1 is set on the basis of the following equation:

VREF1=VIH+VTN+VTP where VIH represents a high level of the input signal, and VTN and VTP represent the absolute values of threshold voltages of an N-channel transistor and a P-channel transistor, respectively.

When the voltage of the input IN is 0 (V), an output of the inverter created at a terminal N65 is on a high level. Accordingly, TN103 is in the nonconducting state, and TN102 is in the conducting state, so that a voltage at a terminal N67 goes to a high level and a voltage at a terminal N66 goes to a low level. As a result, an output OUT goes to a high level. To the contrary, when the voltage of the input IN is higher in level than VIH, the output of the inverter created at the terminal N65 is on a low level. Accordingly, TN102 is in the nonconducting state, and TN103 is in the conducting state, so that the voltage at the terminal N66 goes to a high level and that at the terminal N67 goes to a low level. As a result, the output OUT goes to a low level. Thus, it is possible to construct an input circuit which responds stably to even a reduced input signal swing. Moreover, there is no dc current path from VCC to VSS, and therefore, a current during the stand-by state can be substantially zero.

FIG. 16 shows still another embodiment of the input circuit of the CMOS IC according to the present invention. In the present embodiment, similarly to the embodiment shown in FIG. 15, an example of construction of the input circuit in the case of VIL=0 is shown. In the figure, TN110 to TN112 are N-channel transistors, and TP110 to TP112 are P-channel transistors. To a gate of TN111 is applied a reference voltage VREF2. An input is applied to TN110 and TP110, and sources of TP110 and TN111 are connected to each other. In the present embodiment, instead of creation of an inverted signal of the input, by using TN111 and TP110, a complementary action with respect to an N-channel transistor, i.e., such an action as to conduct when the input is on a low level and to nonconduct when it is on a high level is realized. Those TN110, TN111 and TP110, and further TP111 and TP112 are combined to provide a level conversion function as well as the above function. The value of the reference voltage VREF2 is set on the basis of the following equation:

VREF2=VIH+VTN+VTP where VIH represents a high level of the input signal, and VTN and VTP represent the absolute values of threshold voltages of an N-channel transistor and a P-channel transistor, respectively.

When the voltage of the input IN is 0(V), TN110 is in the nonconducting state, and TN111 and TP110 are in the conducting state, so that a voltage at a terminal N70 goes to a low level and an output OUT goes to a high level. To the contrary, when the input IN is higher in level than VIH, TN111 and TP110 are in the nonconducting state, and TN110 is in the conducting state, so that the voltage at the terminal N70 goes to a high level and the output OUT goes to a low level. Thus, it is possible to construct an input circuit which responds stably to even a reduced signal swing. Moreover, there is no dc current path from VCC to VSS, and therefore, a current during the stand-by state can be substantially zero.

If the input circuit as described hereinabove is used, the amplitude of the input signal can be reduced while maintaining a sufficient noise margin, and therefore, the signal transmission can be carried out at a high speed. Moreover, since a transient current generated along with a switching operation can be reduced, the variation in the supply voltage can be controlled, and the noise margin can be enlarged. Further, since there is no dc current consumption in the stand-by state, the input circuit can be also applied to a battery operation in which a low power consumption is required.

Although the present invention has been described in detail with respect to the specific embodiments, the scope to which the invention is applied is not limited thereto or thereby. For example, in the aforementioned embodiments, the specific case where an LSI is constructed using CMOS transistors and bipolar transistors has been mainly described. However, to an LSI employing junction FETs, and an LSI in which component parts are formed on a substrate made of a material other than silicon, such as gallium arsenide (As), can be applied the present invention as it is.

As set forth hereinabove, according to the present invention, the signal swing can be reduced without the supply voltage per se being decreased, and therefore, an LSI can be provided which never invites an increase in the power consumption which becomes a problem along with the increasing of integration. Moreover, according to the present invention, an LSI can be provided in which a delay time does not increase. Further, according to the present invention, an LSI can be provided which operates at a high speed.

It is further understood by those in the art that the foregoing description is preferred embodiment of the disclosed device and that various changes and modifications may be made in the invention without departing from the spirit and scope thereof.

What is claimed is:

1. A semiconductor integrated circuit including a plurality of CMOS integrated circuit blocks, each of said plurality of CMOS integrated circuit blocks comprising:
    an input signal receiver unit for receiving an input signal having a first signal swing of a relatively small magnitude to convert it into an output signal having a second signal swing of a magnitude larger than that of said first signal swing;
    a signal processing unit for processing said output signal having said second signal swing, from said input signal receiver, to generate an output signal having said second signal swing; and
    an output driving unit for receiving said output signal having said second signal swing from said signal processing unit to convert it into an output having said first signal swing of said relatively small magnitude,
    wherein, in accordance with a given polarity direction, a high level of said second signal swing is higher in amplitude than that of said first signal swing, and a low level of said second signal swing is lower in amplitude than that of said first signal swing.

2. A semiconductor integrated circuit according to claim 1, wherein the magnitude of said first signal swing is less than 1 V.

3. A semiconductor integrated circuit according to claim 2, wherein the magnitude of said first signal swing is equal to the potential difference between the maximum value and the minimum value defined by a supply voltage supplied to the CMOS integrated circuit block.

4. A semiconductor integrated circuit according to claim 2, wherein the magnitude of said second signal swing is equal to the potential difference between the maximum value and the minimum value defined by a supply voltage supplied to the CMOS integrated circuit block.

5. A semiconductor integrated circuit according to claim 1, wherein said input signal receiver unit comprises:
    a first signal level conversion circuit having an input for receiving said input signal of said first signal swing at an input of said input signal receiver unit and having a first output node;
    a second signal level conversion circuit having an input for receiving said input signal of said first signal swing at the input of said input signal receiver unit and having a second output node;
    a first MOS transistor, of a first conductivity type, having a source connected to a first operating potential, a gate connected to said first output node of said first signal level conversion circuit and a drain connected to the output of said input signal receiver unit; and
    a second MOS transistor, of a second conductivity type opposite to said first conductivity type, having a source connected to a second operating potential, a gate connected to said second output node of said second signal level conversion circuit and a drain connected to the output of said input signal receiver unit.

6. A semiconductor integrated circuit according to claim 5, wherein said first signal level conversion circuit comprises:
a third MOS transistor, of said first conductivity type, having a source connected to said first operating potential, a gate connected to said output of said input signal receiver unit and a drain connected to said first output node; and
a fourth MOS transistor, of said second conductivity type, having a source connected to said input of said input signal receiver unit and a drain connected to said first output node, and
wherein said second signal level conversion circuit comprises:
a fifth MOS transistor, of said second conductivity type, having a source connected to said second operating potential, a gate connected to said output of said input a signal receiver unit and a drain connected to said second output node; and
a sixth MOS transistor, of said first conductivity type, having a source connected to said input of said input signal receiver unit and a drain connected to said second output node.

7. A semiconductor integrated circuit according to claim 6, wherein a current flowing between said first operating potential and said second operating potential through respective source-drain paths of said first and second MOS transistors is a negligible value, when said input signal at the input of said input signal receiver unit is equal to a high level or a low level of said first signal swing.

8. A semiconductor integrated circuit according to claim 6, wherein said output driving unit comprises:
a seventh MOS transistor, of said first conductivity type, having a source connected to a third operating potential, a gate connected to the input of said output driving unit and a drain connected to the output of said output driving unit; and
an eighth MOS transistor, of said second conductivity type, having a source connected to a fourth operating potential, a gate connected to the input of said output driving unit and a drain connected to the output of said output driving unit.

9. A semiconductor integrated circuit according to claim 8, wherein absolute values of gate threshold voltages of said seventh and eighth MOS transistors are smaller than those of other MOS transistors included in said CMOS integrated circuit block.

10. A semiconductor integrated circuit according to claim 5, wherein a current flowing between said first operating potential and said second operating potential through respective source-drain paths of said first and second MOS transistors is a negligible value, when said input signal at the input of said input signal receiver unit is equal to a high level or a low level of said first signal swing.

11. A semiconductor integrated circuit according to claim 5, wherein said output driving unit comprises:
a third MOS transistor, of said first conductivity type, having a source connected to a third operating potential, a gate connected to the input of said output driving unit and a drain connected to the output of said output driving unit; and
a fourth MOS transistor, of said second conductivity type, having a source connected to a fourth operating potential, a gate connected to the input of said output driving unit and a drain connected to the output of said output driving unit.

12. A semiconductor integrated circuit according to claim 11, wherein absolute values of gate threshold voltages of said third and fourth MOS transistors are smaller than those of other MOS transistors included in said CMOS integrated circuit block.

13. A semiconductor integrated circuit according to claim 1, wherein said output driving unit comprises:
a first MOS transistor, of a first conductivity type, having a source connected to a first operating potential, a gate connected to the input of said output driving unit and a drain connected to the output of said output driving unit; and
a second MOS transistor, of a second conductivity type, opposite to said first conductivity type, having a source connected to a second operating potential, a gate connected to the input of said output driving unit and a drain connected to the output of said output driving unit.

14. A semiconductor integrated circuit according to claim 13, wherein absolute values of age threshold voltages of said first and second MOS transistors are smaller than those of other MOS transistors included in said CMOS integrated circuit block.

15. A semiconductor apparatus including a plurality of CMOS integrated circuits, each of said plurality of CMOS integrated circuits comprising:
an input signal receiver unit for receiving an input signal having a first signal swing of a relatively small magnitude to convert it into an output signal having a second signal swing of a magnitude larger than that of said first signal swing;
a signal processing unit for processing said output signal having said second signal swing, from said input signal receiver, to generate an output signal having said second signal swing; and
an output driving unit for receiving said output signal having said second signal swing from said signal processing unit to convert it into an output having said first signal swing of said relatively small magnitude,
wherein, in accordance with a given polarity direction, a high level of said second signal swing is higher in amplitude than that of said first signal swing, and a low level of said second signal swing is lower in amplitude than that of said first signal swing.

16. A semiconductor apparatus according to claim 15, wherein the magnitude of said first signal swing is less than 1 V.

17. A semiconductor apparatus according to claim 16, wherein the magnitude of said first signal swing is equal to the potential difference between the maximum value and the minimum value defined by a supply voltage supplied to the CMOS integrated circuit.

18. A semiconductor apparatus according to claim 16, wherein the magnitude of said second signal swing is equal to the potential difference between the maximum value and the minimum value defined by a supply voltage supplied to the CMOS integrated circuit.

19. A semiconductor apparatus according to claim 15, wherein said input signal receiver unit comprises:
a first signal level conversion circuit having an input for receiving said input signal of said first signal swing at an input of said input signal receiver unit and having a first output node;
a second signal level conversion circuit having an input for receiving said input signal of said first signal swing at the input of said input signal receiver unit and having a second output node;

a first MOS transistor, of a first conductivity type, having a source connected to a first operating potential, a gate connected to said first output node of said first signal level conversion circuit and a drain connected to the output of said input signal receiver unit; and a second MOS transistor, of a second conductivity type opposite to said first conductivity type, having a source connected to a second operating potential, a gate connected to said second output node of said second signal level conversion circuit and a drain connected to the output of said input signal receiver unit.

20. A semiconductor apparatus according to claim 19,
wherein said first signal level conversion circuit comprises:
a third MOS transistor, of said first conductivity type, having a source connected to said first operating potential, a gate connected to said output of said input signal receiver unit and a drain connected to said first output node; and
a fourth MOS transistor, of said second conductivity type, having a source connected to said input of said input signal receiver unit and a drain connected to said first output node, and
wherein said second signal level conversion circuit comprises:
a fifth MOS transistor, of said second conductivity type, having a source connected to said second operating potential, a gate connected to said output of said input a signal receiver unit and a drain connected to said second output node; and
a sixth MOS transistor, of said first conductivity type, having a source connected to said input of said input signal receiver unit and a drain connected to said second output node.

21. A semiconductor apparatus according to claim 20, wherein a current flowing between said first operating potential and said second operating potential through respective source-drain paths of said first and second MOS transistors if s negligible value, when said input signal at the input of said input signal receiver unit is equal to a high level or a low level of said first signal swing.

22. A semiconductor apparatus according to claim 20, wherein said output driving unit comprises:
a seventh MOS transistor, of said first conductivity type, having a source connected to a third operating potential, a gate connected to the input of said output driving unit and a drain connected to the output of said output driving unit; and an eighth MOS transistor, of said second conductivity type, having a source connected to a fourth operating potential, a gate connected to the input of said output driving unit and a drain connected to the output of said output driving unit.

23. A semiconductor apparatus according to claim 22, wherein absolute value of gate threshold voltages of said seventh and eighth MOS transistors are smaller than those of other MOS transistors included in said CMOS integrated circuit.

24. A semiconductor apparatus according to claim 19, wherein a current flowing between said first operating potential and said second operating potential through respective source-drain paths of said first and second MOS transistors is a negligible value, when said input signal at the input of said input signal receiver unit is equal to a high level or a low level of said first signal swing.

25. A semiconductor apparatus according to claim 19, wherein said output driving unit comprises:
a third MOS transistor, of said first conductivity type, having a source connected to a third operating potential, a gate connected to the input of said output driving unit and a drain connected to the output of said output driving unit; and
an fourth MOS transistor, of said second conductivity type, having a source connected to a fourth operating potential, a gate connected to the input of said output driving unit and a drain connected to the output of said output driving unit.

26. A semiconductor apparatus according to claim 25, wherein absolute values of gate threshold voltages of sad third and fourth MOS transistors are smaller than those of other MOS transistors included in said CMOS integrated circuit.

27. A semiconductor apparatus according to claim 15, wherein said output driving unit comprises:
a first MOS transistor, of a first conductivity type, having a source connected to a first operating potential, a gate connected to the input of said output driving unit and a drain connected to the output of said output driving unit; and
a second MOS transistor, of a second conductivity type opposite to said first conductivity type, having a source connected to a second operating potential, a gate connected to the input of said output driving unit and a drain connected to the output of said output driving unit.

28. A semiconductor apparatus according to claim 27, wherein absolute values of gate threshold voltages of said first and second MOS transistors are smaller than those of other MOS transistors included in said CMOS integrated circuit.

* * * * *